(12) United States Patent
Okajima et al.

(10) Patent No.: US 9,331,296 B2
(45) Date of Patent: May 3, 2016

(54) ORGANIC LIGHT-EMITTING DEVICE

(75) Inventors: Maki Okajima, Kawasaki (JP); Keiji Okinaka, Narashino (JP); Tetsuo Takahashi, Kawasaki (JP); Hajime Muta, Zama (JP); Yohei Iwasaki, Tokyo (JP); Minako Nakasu, Tokyo (JP); Naoki Yamada, Inagi (JP); Yosuke Nishide, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 871 days.

(21) Appl. No.: 13/634,505

(22) PCT Filed: Mar. 14, 2011

(86) PCT No.: PCT/JP2011/056674
§ 371 (c)(1),
(2), (4) Date: Sep. 12, 2012

(87) PCT Pub. No.: WO2011/122384
PCT Pub. Date: Oct. 6, 2011

(65) Prior Publication Data
US 2013/0001542 A1    Jan. 3, 2013

(30) Foreign Application Priority Data
Mar. 31, 2010  (JP) .................................. 2010-082817

(51) Int. Cl.
*H01L 51/54* (2006.01)
*H01L 51/50* (2006.01)
*C09K 11/06* (2006.01)
*H05B 33/14* (2006.01)
*H01L 51/00* (2006.01)

(52) U.S. Cl.
CPC ............ *H01L 51/5004* (2013.01); *C09K 11/06* (2013.01); *H01L 51/5012* (2013.01); *H01L 51/5096* (2013.01); *H05B 33/14* (2013.01); *C09K 2211/1011* (2013.01); *H01L 51/0052* (2013.01); *H01L 51/0054* (2013.01); *H01L 51/0085* (2013.01)

(58) Field of Classification Search
None
See application file for complete search history.

(56) References Cited

U.S. PATENT DOCUMENTS

| 2001/0021478 A1* | 9/2001 | Shi et al. ...................... 430/57.1 |
| 2006/0159951 A1* | 7/2006 | Falcou et al. ................. 428/690 |
| 2009/0066227 A1* | 3/2009 | Okinaka et al. .............. 313/504 |
| 2009/0079331 A1* | 3/2009 | Igawa et al. .................. 313/504 |
| 2009/0096368 A1* | 4/2009 | Kamatani et al. ............. 313/504 |

FOREIGN PATENT DOCUMENTS

| CN | 101185177 A | 5/2008 | |
| JP | 2002359080 A | 12/2002 | |
| JP | 2007318063 A | 12/2007 | |
| JP | 2008277494 A | 11/2008 | |
| JP | 2008294404 A | 12/2008 | |
| JP | 2009147276 A | 7/2009 | |
| JP | 2009277984 A | 11/2009 | |
| JP | 2009302516 A | 12/2009 | |
| JP | 201157651 A | 3/2011 | |
| JP | 201191449 A | 5/2011 | |
| WO | WO 2010107037 A1 * | 9/2010 | ............. H01L 51/00 |

* cited by examiner

*Primary Examiner* — Andrew K Bohaty
(74) *Attorney, Agent, or Firm* — Canon U.S.A. Inc., IP Division

(57) ABSTRACT

Aspects of the present invention provide a blue organic light-emitting device having a continuous operation lifetime.

An organic light-emitting device includes a light-emitting layer containing a dopant having the ability to trap electrons or holes, and a hole-blocking layer or electron-blocking layer, in which the difference between the LUMO of the dopant and the LUMO of a host material, the size relationship between the HOMO of the host material and the HOMO of the dopant, and the difference between the T1 of the host material and the T1 of the hole-blocking layer or between the T1 of the host material and the T1 of the electron-blocking layer, are specified.

6 Claims, 4 Drawing Sheets

ORGANIC LIGHT-EMITTING DEVICE

TECHNICAL FIELD

The present invention relates to organic light-emitting devices including organic compounds, and more specifically, to an organic light-emitting device that emits light by applying a voltage to a thin film composed of an organic compound.

BACKGROUND ART

An organic light-emitting device includes a thin film which contains a light-emitting organic compound and which is arranged between an anode and a cathode, and is driven by applying a voltage between the electrodes to inject holes and electrons. The holes and the electrons recombine in the device to excite the light-emitting organic compound. Light emitted when the light-emitting organic compound returns from the excited state to the ground state is used.

There have been recent significant advances in organic light-emitting devices. Organic light-emitting devices have high luminance at low applied voltages, various emission wavelengths, and rapid response and are thin and lightweight. This suggests the possibility that they are used in a wide variety of applications.

However, in the case where the application of organic light-emitting devices to, for example, full-color displays is contemplated, current devices have insufficient stability from a practical standpoint. In particular, blue-light-emitting devices have a problem of a reduction in luminous efficiency with time during a continuous operation. It is necessary to overcome the problem.

The reduction in luminous efficiency may be caused by the deterioration of a light-emitting layer via an excited state, i.e., a gradual deterioration of the light-emitting layer due to the repeated excitation and relaxation. Hereinafter, the deterioration is referred to as "deterioration via an excited state". In PTL 1, in order to reduce an excited triplet state of a light-emitting layer material that may be highly associated with the deterioration via an excited state, a triplet-state quencher is incorporated together with the light-emitting layer material, thereby preventing the deterioration.

CITATION LIST

Patent Literature

PTL 1 Japanese Patent Laid-Open No. 2002-359080

SUMMARY OF INVENTION

Technical Problem

However, details of the mechanism of the deterioration via an excited state have been unclear in the past. So, it was impossible to design a material resistant to the deterioration via an excited state from the viewpoint of a molecular structure. As described in PTL 1, even if the excited triplet state of the light-emitting layer material is reduced by the triplet-state quencher, the continuous operation lifetime has not been sufficient from a practical standpoint. The present invention solves the foregoing problems and provides a blue-light-emitting device having a long continuous operation lifetime.

According to one aspect of the present invention, an organic light-emitting device includes a pair of electrodes having an anode and a cathode, a light-emitting layer arranged between the pair of electrodes and containing a host material and a blue-fluorescent dopant material having the ability to trap electrons, and a hole-blocking layer adjacent to the light-emitting layer, in which the energy of the lowest unoccupied molecular orbital of the host material (LUMO (host)) and the energy of the LUMO of the blue-fluorescent dopant material (LUMO (dopant)) satisfy the following expression:

|LUMO(dopant)|−|LUMO(host)|>0.15 eV, the energy of the highest occupied molecular orbital of the host material (HOMO (host)) and the energy of the HOMO of the blue-fluorescent dopant material (HOMO (dopant)) satisfy the following expression:

|HOMO(host)|<|HOMO(dopant)|, the energy of the lowest excited triplet state of the host material (T1(host)) and the energy of the lowest excited triplet state of the hole-blocking layer (T1(HBL)) satisfy the following expression:

T1(host)−T1(HBL)>0.1 eV, the host material and a material for the hole-blocking layer are different hydrocarbon compounds, each of the hydrocarbon compounds having a plurality of mono- or higher-valent unsubstituted or alkyl-substituted aromatic hydrocarbon moieties, and the aromatic hydrocarbon moieties being linked together only by a single bond, and a substructure containing the single bond and the aromatic hydrocarbon moieties linked together by the single bond is represented only by general formula [1] or [2]:

[Chem. 1]

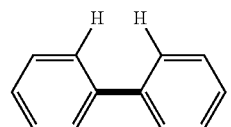

[1]

[Chem. 2]

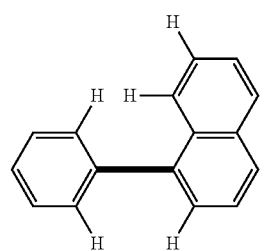

[2]

(wherein thick lines illustrated in formulae [1] and [2] each indicate the single bond).

According to another aspect of the present invention, an organic light-emitting device includes a pair of electrodes having an anode and a cathode, a light-emitting layer arranged between the pair of electrodes and containing a host material and a blue-fluorescent dopant material having the ability to trap holes, and an electron-blocking layer adjacent to the light-emitting layer, in which the energy of the lowest unoccupied molecular orbital of the host material (LUMO (host)) and the energy of the LUMO of the blue-fluorescent dopant material (LUMO (dopant)) satisfy the following expression:

|LUMO(host)|>|LUMO(dopant)|, the energy of the highest occupied molecular orbital of the host material (HOMO (host)) and the energy of the HOMO of the blue-fluorescent dopant material (HOMO (dopant)) satisfy the following expression:

|HOMO(host)|−|HOMO(dopant)|>0.15 eV, the energy of the lowest excited triplet state of the host material (T1(host)) and the energy of the lowest excited triplet state of the electron-blocking layer (T1 (EBL)) satisfy the following expression:

T1(host)−T1(EBL)>0.1 eV, the host material and a material for the electron-blocking layer are different hydrocarbon compounds, each of the hydrocarbon compounds having a plurality of mono- or higher-valent unsubstituted or alkyl-substituted aromatic hydrocarbon moieties, and the aromatic hydrocarbon moieties being linked together only by a single bond, and a substructure containing the single bond and the aromatic hydrocarbon moieties linked together by the single bond is represented only by general formula [1] or [2]:

[Chem. 3]

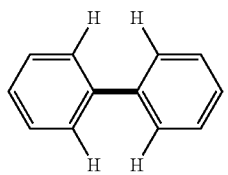

[1]

[Chem. 4]

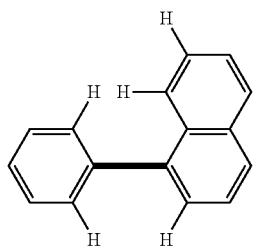

[2]

(wherein thick lines illustrated in formulae [1] and [2] each indicate the single bond).

DESCRIPTION OF EMBODIMENTS

Figure 1:
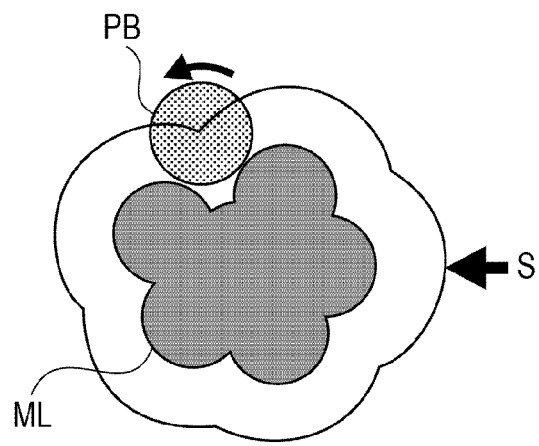
FIG. 1 is a conceptual view illustrating a typical method for calculating an exposed surface area.

The inventors attempted to develop an organic blue-light-emitting device having improved a continuous operation lifetime by an approach different from the related art. More specifically, the inventors attempted to elucidate the details of the mechanism of the deterioration via an excited state, find a material resistant to the deterioration via an excited state from the viewpoint of a molecular structure, and form the optimum device structure to improve the route that causes the deterioration of the organic light-emitting device.

To elucidate the details of the mechanism of the deterioration via an excited state and find the features of the molecular structure of a material resistant to the deterioration via an excited state, the inventors conducted verification experiments described below.

Verification Experiment and Finding from Verification Experiment (1) Verification Experiment (1-1) Production of Sample for Verification Experiments Production of Sample 1

Indium tin oxide (ITO) was deposited by sputtering on a glass substrate so as to form a film, which served as an anode, having a thickness of 130 nm. The resulting substrate was used as a transparent conductive supporting substrate. The substrate was subjected to ultrasonic cleaning in acetone and then isopropyl alcohol (IPA), boiling cleaning with IPA, drying, and UV/ozone cleaning.

Then compound S-1 was deposited on the substrate by vacuum evaporation from a boat to form an organic single layer having a thickness of 50 nm.

[Chem. 5]

Compound S-1

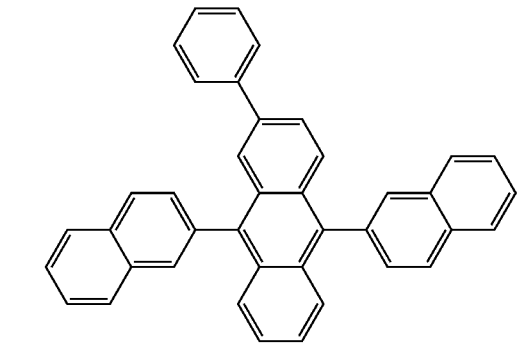

Furthermore, an aluminum film having a thickness of 150 nm was formed by vacuum evaporation, thereby providing sample 1.

The resulting sample was covered with a protective glass plate in a nitrogen atmosphere with a dew point of −70° C. or lower so as not to adsorb water, and was sealed with an epoxy-based adhesive. Note that a recess was formed on the adhesive surface side of the protective glass, and a moisture-absorbent sheet (a moisture getter sheet for organic EL, manufactured by Dynic Corporation) was arranged therein.

Production of Other Samples

Other samples were produced in the same way as sample 1, except that compounds (40 types) each capable of being used as a material for the light-emitting layer of an organic blue-light-emitting device were used in place of compound S-1.

(1-2-A) Details of Verification Experiment A

Verification Experiment A of Sample 1

Sample 1 was irradiated with light having a wavelength of 365 nm from the glass substrate side at an irradiation intensity of 5.4 W/cm² while a voltage between the electrodes was maintained at 0 V, i.e., sample 1 was not energized. Absorption of irradiation light by the organic layer yields an excited state (including a singlet excited state and an excited triplet state partially formed by intersystem crossing). A change in the photoluminescence intensity of the organic layer with time was measured, and τ obtained when the curve of deterioration via an excited state was fitted using expression 1 was defined as a deterioration time of compound S-1 via an excited state. The deterioration time τ of sample 1 via an excited state was 210 hours.

[Math. 1]

$$\frac{L}{L_0} = e^{-\left(\frac{t}{\tau}\right)^\alpha}$$  Expression 1 where
$L_0$: initial photoluminescence intensity;
L: photoluminescence intensity at time t (hour);
t: time t (hour);
α: shape factor of a curve of deterioration via an excited state; and
τ: lifetime defined by a time when the photoluminescence intensity reaches 1/e.

Verification Experiment A of Other Samples

A deterioration time τ of each of the compounds (40 types) via an excited state was determined as in verification experiment A of sample 1. Here, the irradiation intensity was set in such a manner that the number of photons absorbed by the organic layer of each sample per unit time is about the same as that of another sample. A voltage between the electrodes was maintained at 0 V, i.e., each sample was not energized.

(1-2-B) Details of Verification Experiment B

Verification Experiment B of Sample 1

Sample 1 was irradiated with light for 114 hours as verification experiment A (1-2-A). The photoluminescence intensity was reduced to 50% of the photoluminescence intensity before irradiation. An organic substance contained in the organic layer of sample 1 after irradiation was identified with a normal-phase LC-APPI-FTMS/DAD/FLD system. Agilent 1100 (manufactured by Agilent Technologies) and LTQ Orbitrap XL (manufactured by Thermo Fisher Scientific Inc.) were used as the system. A compound having a structure in which a phenyl group was detached from compound S-1 and a compound having a structure in which a naphthyl group was detached from compound S-1 were detected in addition to compound S-1. The formation of each of the detected compounds requires the dissociation of the bond between the anthracene skeleton of compound S-1 and the phenyl group or the naphthyl group. Furthermore, a phenyl-group adduct of compound S-1, a naphthyl-group adduct of compound S-1, and isomers thereof were detected. These detected compounds are formed by recombination of a phenyl group and a naphthyl group separated by bond dissociation with other substances. Note that the foregoing detected compounds were not detected from sample 1 that had not been irradiated with light.

Verification Experiment B of Other Samples

Organic substances contained in organic layers of samples of other compounds before and after irradiation with light were identified as in verification experiment B of sample 1. Similarly to verification experiment B of sample 1, various degraded substances formed by bond dissociation were detected.

(2) Findings from Verification Experiment

The inventors have conducted intensive studies by verification experiments A and B described in section (1). Findings from the studies will be described in section (2-1) to (2-3).

(2-1) Features of Molecular Structure of Material Resistant to Deterioration Via Excited State First, the inventors noticed phenomena described in items (i) and (ii) from verification experiment A. That is, degrees of deterioration of the substances via an excited state are determined by their molecular structures.

(i) A substance having a long deterioration time via an excited state (resistant to deterioration via an excited state) has a plurality of mono- or higher-valent aromatic hydrocarbon moieties each optionally substituted with an alkyl group, the aromatic hydrocarbon moieties being linked together only by a single bond.

In contrast, for example, substances containing amino groups and heterocycles have short deterioration times via an excited state (less resistant to the deterioration via an excited state).

(ii) Among the hydrocarbon compounds described in section (2-1), when a substructure containing the single bond and the aromatic hydrocarbon moieties linked together by the single bond is represented only by general formula [1] or [2]:

[Chem. 6]

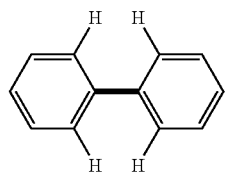

[1]

[Chem. 7]

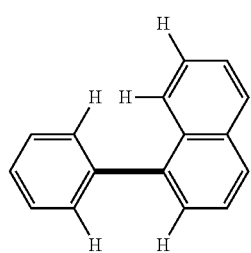

[2]

(wherein thick lines illustrated in formulae [1] and [2] each indicate the single bond), a compound having the substructure is resistant to the deterioration via an excited state.

In contrast, a compound having another type of bonding is less resistant to deterioration via an excited state.

That is, examples of the compound having another type of bonding include compounds having substructures each containing the single bond and the aromatic hydrocarbon moieties linked together by the single bond, the substructures being represented by general formulae [3] to [5]. Examples of the compound having another type of bonding further include compounds having substructures each containing two single bonds and three aromatic hydrocarbon moieties linked by the two single bonds, the substructures being represented by general formulae [6] to [8].

[Chem. 8]

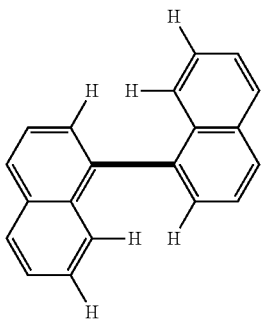

[Chem. 9]

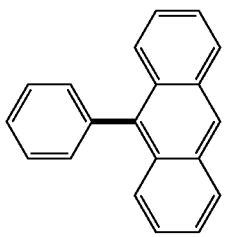

[Chem. 10]

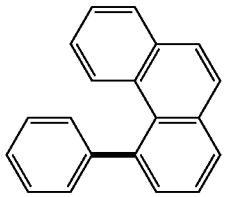

[Chem. 11]

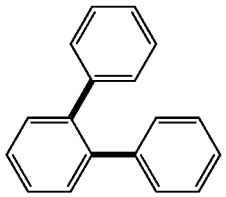

[Chem. 12]

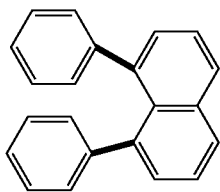

[Chem. 13]

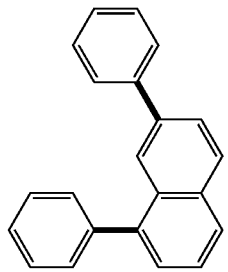

(wherein thick lines illustrated in formulae [3] to [8] each indicate the single bond).

(2-2) Mechanism of Deterioration Via Excited State

The inventors elucidates the mechanism of deterioration via an excited state on the basis of the phenomenon (2-1) in which the degrees of deterioration of the substances via an excited state are determined by their molecular structures. That is, the inventors thought that for the single film composed of a compound capable of being used as a material for a blue-light-emitting layer, the deterioration via an excited state is caused by the fact that some of radical pairs generated by bond cleavage diffuse apart without recombination and that the residual radicals quench emission.

The reason the inventors conceive the idea will be described below.

In verification experiment B, various degraded substances formed by dissociation of the single bond were detected from the samples after irradiation with light. This result suggests that the deterioration via an excited state is mainly caused by dissociation of the single bond.

The dissociation energies of a single bond (C—C single bond) between a C atom of an aromatic hydrocarbon and a C atom of an aromatic hydrocarbon and the dissociation energies of a C—C single bond between an aromatic hydrocarbon and an alkyl group are each about 4 to about 5 eV. Meanwhile, for example, the dissociation energies of a single bond (C—N single bond) between the C atom of an aromatic hydrocarbon and a N atom of an amino group and the dissociation energies of a C—N single bond between a heterocycle and an aromatic hydrocarbon are each about 3 to about 4 eV. The dissociation energy of the C—N single bond is lower than that of the C—C single bond. So, the C—N single bond is liable to dissociate via an excited state. It is thus important for a material for a blue-light-emitting layer resistant to the deterioration via an excited state to satisfy item (i) described in section (2-1). A material, for a blue-light-emitting layer, having the C—C single bond between aromatic hydrocarbon moieties, each being optionally substituted with an alkyl group, is less likely to undergo bond dissociation when the material is just excited to the lowest excited singlet state S1 and the lowest excited triplet state T1.

In the case of the material, for a blue-light-emitting layer, having the C—C single bond between aromatic hydrocarbon moieties, the single bond is probably cleaved from a higher excited state having a higher energy than the dissociation energy of the C—C single bond. The inventors infer that the high-energy state is the higher excited triplet state Tn.

Energy is transferred from another molecule in the lowest excited singlet state S1 to a molecule in the lowest excited triplet state T1, thereby generating the higher excited triplet state Tn. In this case, the energy of the higher excited triplet state Tn is equal to the sum of the energy of lowest excited triplet state T1 and the energy of the lowest excited singlet state S1.

It is inferred that the foregoing energy-transfer process occurs relatively frequently because the lowest excited triplet state T1 has a long excited state lifetime and a high density in the film.

As with the material that can be used for a blue-light-emitting layer of the sample in the verification experiment, in the case where the energy of the lowest excited singlet state S1 is as high as about 3.0 eV, it is quite possible that the energy of the higher excited triplet state Tn generated by the energy transfer is equal to or higher than the dissociation energy of the C—C single bond. Thus, in the case of the material, for the blue-light-emitting layer, having the C—C single bond between aromatic hydrocarbon moieties, each being optionally substituted with an alkyl group, most of the C—C single bonds may be cleaved because the material is in the higher excited triplet state Tn generated by the energy transfer.

It is generally known that radical pairs formed by bond cleavage behave according to two processes: they recombine and return to single bonds; and they diffuse apart and become free radicals. It is known that which process is dominant among the two processes is mainly determined by two factors. As a first factor, an environment in which radical pairs are present (vapor phase or condensed phase) affects the behavior. For a vapor phase, radical pairs are less likely to be affected by other molecules; hence, they are likely to diffuse apart and become free radicals. For a condensed phase, a pair of two radicals is surrounded by other molecules and is in a state as if the pair is confined in a cage. In this state, the diffusion of the radical pair is inhibited by surrounding other molecules. Thus, the process in which the radical pair recombines and returns to the single bond is dominant. In fact, for a high-viscosity solvent, this effect is known to be increased. This phenomenon is referred to as a cage effect. As a second factor, steric hindrance affects the recombination of radical pair. The recombination of the radical pair is caused by the collision of the reactive sites of the radical pair. If a bulky atom or substituent is present near the reactive sites of the two radicals, the bulky atom or substituent hinders the two radicals from approaching each other. So, the recombination is less likely to proceed. Here, in the case where radical rearrangement is substantially negligible, the reactive sites of the two radicals are two atoms that were bonded by a bond before the cleavage of the bond. Furthermore, it is inferred that the molecular structure of the radical pair before diffusion is not significantly different from that before the bond cleavage. Thus, the recombination of the radical pair is affected by the degree of steric hindrance (bulkiness) around the bond before bond cleavage. As an application example, in the field of coating films composed of polymers, a material having a molecular structure with a high degree of steric hindrance to prevent the recombination of radicals is actually used as a photopolymerization initiator in order to efficiently generate free radicals.

For samples in the verification experiment and organic electroluminescent (EL) devices, radical pairs are surrounded by other molecules and are much less likely to diffuse because of their film states. So, it is believed that the radical pairs recombine easily and return to single bonds. That is, the radical pairs are present in an environment in which a particularly strong cage effect is provided. In this case, the inventors thought that whether radicals generated by bond cleavage recombine, or diffuse and become free radicals (i.e., whether quenchers are formed to degrade the material) depends dominantly on the second factor, which is the degree of steric hindrance (bulkiness) around the single bond.

With respect to the substructure containing the single bond between the aromatic hydrocarbon moieties described in item (ii) of section (2-1) "Features of Molecular Structure of Material Resistant to Deterioration via Excited State", each of the substructures represented by general formulae [1] and [2] generally has a low degree of steric hindrance around the single bond, compared with general formulae [3] to [8]. This indicates that in the case of the hydrocarbon compound described in item (i) of section (2-1), the degree of deterioration via an excited state is determined by the bulkiness (the degree of steric hindrance) around the single bond between the aromatic hydrocarbon moieties, as the foregoing inference. At the higher excited triplet state Tn, most of single bonds between aromatic hydrocarbon moieties are cleaved. In this case, the degree of deterioration via an excited state is believed to be determined by the extent to which generated radical pairs recombine efficiently and return to the single bond (the extent to which the generation of radicals is inhibited). Furthermore, there is no certain relationship between the degree of deterioration via an excited state and the presence or absence of the C—C single bond that links an aromatic hydrocarbon moiety with an alkyl group. This is presumably because although the C—C single bond between the aromatic hydrocarbon moiety and the alkyl group is also cleaved in the higher excited triplet state Tn, the degree of recombination is high, compared with the case of the single bond between the aromatic hydrocarbon moieties.

For a heterocycle-containing material, a C atom adjacent to the heteroatom needs to be substituted with an aromatic hydrocarbon group or the like because the heteroatom serves as an active site to facilitate a deteriorative reaction. In this case, the C—C single bond between the aromatic hydrocarbon group and a C atom adjacent to the heteroatom in the heterocycle has a dihedral angle close to 0°. Thus, the degree of steric hindrance is liable to be high. The heterocycle-containing material was less resistant to the deterioration via an excited state in the verification experiment even when all single bonds between aromatic rings were C—C single bonds. This is presumably because the steric hindrance inhibits the recombination.

(2-3) Relationship Between Deterioration Via Excited State and Exposed Surface Area The inventors further analyzed the finding that the degree of deterioration via an excited state is determined by the degree of steric hindrance around the single bond between the aromatic hydrocarbon moieties. That is, the inventors attempted to quantify the degree of steric hindrance around the C—C single bond by the calculation of an exposed surface area and to find the relationship between the exposed surface area and the deterioration time via an excited state.

The exposed surface area commonly indicate the area of a surface defined by plotting the locus of the center of the probe sphere, i.e., an accessible surface area, when a probe sphere likened to an atom or a molecule is rolled over the surface of a molecule. FIG. 1 is a conceptual view illustrating an exposed surface area. In the figure, S represents an exposed surface area, ML represents a molecule in consideration of a van der Waals radius, and PB represents a probe sphere. For the sake of simplicity, FIG. 1 is two-dimensionally illustrated. In fact, however, the accessible surface area is a three-dimensional concept.

According to aspects of the present invention, the bulkiness (the degree of steric hindrance) of a molecule around the single bond between the aromatic hydrocarbon moieties was evaluated by calculating the exposed surface area of a specific region, i.e., around the center of the single bond between the aromatic hydrocarbon moieties. This is because an exposed portion (exposed surface area) around the single bond varies depending on the bulkiness. Specifically, atoms located 3.0 Å from the single bond between the aromatic hydrocarbon moieties are selected. The radius of the probe sphere was set to 1.7 Å. The sum of the exposed surface areas of these atoms was calculated. With respect to the structure of the molecule, a stable structure in the lowest excited triplet state T1 determined by molecular orbital calculation was used. This is because it is believed that bond cleavage, the generation of a radical pair, and recombination thereof occur quite rapidly and the stable structure in the lowest excited triplet state T1 is highly likely to be maintained.

In this way, the exposed surface area of the single bond between aromatic hydrocarbon moieties of each hydrocarbon compound was calculated. Then the inventors conducted studies on the relationship between the exposed surface area and the deterioration time T via an excited state determined by verification experiment A described in section (1-2-A). The results demonstrate that the minimum value of the exposed surface areas of the single bonds between the aromatic hydrocarbon moieties (the minimum value of all the resulting exposed surface areas of the single bonds) shows a very good correlation with the logarithm of the deterioration time T via an excited state. This indicates that for a material having a plurality of C—C single bonds, the C—C single bond in which a radical pair generated by bond cleavage thereof is least likely to recombine (the C—C single bond having the highest degree of steric hindrance) is believed to be a factor that controls the degree of deterioration via an excited state.

The C—C single bond having the highest degree of steric hindrance is a C—C single bond having the minimum value of the exposed surface areas of the C—C single bonds.

The upper limit of the exposed surface area of the single bond between the aromatic hydrocarbon moieties is about 140. This is determined by checking the relationship between the dihedral angle and the exposed surface area of p-biphenyl, which probably has the highest exposed surface area. It was also found that the exposed surface area of a C—C single bond between an alkyl group and an aromatic hydrocarbon moiety is about 200 or more. A radical pair generated from the C—C single bond between the alkyl group and the aromatic hydrocarbon moiety is much more likely to recombine, compared with a single bond between aromatic hydrocarbon moieties. This is the same result as that of the inference described in section (2-2).

As described above, the inventors first elucidated the mechanism of the deterioration via an excited state on the basis of the series of experiments. The findings enable us to design the molecular structure of a material resistant to the deterioration via an excited state.

The inventors further conducted intensive studies and conceived the operation mechanism of the present invention. That is, the inventors invented the optimum device structure to prevent deterioration of an organic light-emitting device.

Operation Mechanism of the Invention

According to aspects of the present invention, by meeting all requirements (1) to (4) described below, the requirements are functionally related to each other. This makes it possible to maximally inhibit the deterioration via an excited state and to provide an organic light-emitting device having a long continuous operation lifetime.

(1) According to aspects of the present invention, an organic light-emitting device includes a pair of electrodes having an anode and a cathode, a light-emitting layer arranged between the pair of electrodes, and a hole-blocking layer adjacent to the light-emitting layer, the light-emitting layer containing a host material and a dopant material having the ability to trap electrons.

(2) According to aspects of the present invention, the energy of the lowest excited triplet state of the hole-blocking layer is set to an energy 0.1 eV lower than that of the host material.

(3) According to aspects of the present invention, the host material and a material for the hole-blocking layer are hydrocarbon compounds, each of the hydrocarbon compounds having a plurality of mono- or higher-valent unsubstituted or alkyl-substituted aromatic hydrocarbon moieties, and the aromatic hydrocarbon moieties being linked together only by a single bond. A substructure containing the single bond and the aromatic hydrocarbon moieties linked together by the single bond is represented only by general formula [1] or [2] described above.

(4) The dopant material according to aspects of the present invention is a blue-fluorescent dopant material.

In requirement (1) according to aspects of the present invention, the term "dopant having the ability to trap electrons" indicates a dopant that effectively traps electrons but does not trap holes in the light-emitting layer. So, the dopant material having the ability to trap electrons has the effect of allowing a region where holes and electrons recombine in the light-emitting layer to shift to a portion of the light-emitting layer near the cathode. In the case where the recombination region shift to the cathode side of the light-emitting layer as described above, the possible leakage of holes to a layer which is adjacent to the light-emitting layer and which is located near the cathode needs to be eliminated. To prevent the leakage of holes from the light-emitting layer to a layer adjacent to the cathode and to allow the recombination region of holes and electrons injected from both electrodes to be located in the light-emitting layer, the layer adjacent to the light-emitting layer and near the cathode serves as the hole-blocking layer.

In the light-emitting layer, the recombination of holes and electrons in the light-emitting layer generates excited states (singlet state and triplet state). It is believed that energy transfer after the generation of the excited state provides higher excited triplet states Tn of the materials contained in the organic layers and that bond cleavage and the recombination of radical pairs are repeated to cause the deterioration of the materials contained in the organic layers. In requirement (1), as the materials contained in the organic layers that undergo the deterioration via an excited state, two main materials are exemplified. The first is a material contained in the light-emitting layer where holes and electrons recombine, in particular, the host material contained in the light-emitting layer, the proportion of the host material being high. The second is a material contained in the hole-blocking layer adjacent to the light-emitting layer, the hole-blocking layer being located near the region where holes and electrons recombine, provided that requirement (2) is met. In requirement (1), the region where holes and electrons recombine is located in the portion of the light-emitting layer near the cathode. Thus, a higher excited triplet state Tn due to energy transfer is less likely to be generated in a layer adjacent to the light-emitting layer and near the anode, thereby reducing the degree of deterioration via an excited state.

With respect to requirement (2), in the case where requirement (1) is met, the energy of the lowest excited triplet state T1 is assuredly transferred from the host material contained in the light-emitting layer to the hole-blocking layer. This makes it possible to a reduction in the density of the lowest excited triplet state T1 of the host material contained in the light-emitting layer, thereby reducing the proportion in which the host material contained in the light-emitting layer is excited to the higher excited triplet state Tn and then undergoes bond cleavage. In the case where requirement (2) is not met, i.e., in the case where the energy of the lowest excited triplet state of the hole-blocking layer is higher than that of the host material, the energy of the lowest excited triplet state is not transferred from the host material contained in the light-emitting layer to the hole-blocking layer, thereby increasing the degree of deterioration via an excited state of the host material contained in the light-emitting layer. Furthermore, the energy of the lowest excited triplet state T1 of an organic thin film is believed to vary to some extent. So, the fact that the energy of the lowest excited triplet state T1 of the layer adjacent to the light-emitting layer is just lower than the energy of the lowest excited triplet state T1 of the host material contained in the light-emitting layer is insufficient to reliably transfer the energy of the lowest excited triplet state T1 from the host material contained in the light-emitting layer to the layer adjacent to the light-emitting layer. Hence, as described in requirement (2), the energy of the lowest excited triplet state of the hole-blocking layer is an energy 0.1 eV lower than that of the host material contained in the light-emitting layer.

Meeting requirement (3) permits the host material contained in the light-emitting layer and the material contained in the hole-blocking layer to have higher resistance to the deterioration via an excited state. Meeting requirements (1) and (2) makes it possible to disperse the lowest excited triplet state T1 over the host material contained in the light-emitting layer and the hole-blocking layer adjacent to the light-emitting layer. If, however, requirement (3) is not met, radical pairs generated by bond cleavage are less likely to recombine, thereby increasing the degrees of deterioration via an excited state of the host material contained in the light-emitting layer and the material contained in the hole-blocking layer, which is an opposite effect.

Meeting requirement (4) particularly increases the effect of inhibiting the deterioration via an excited state obtained by meeting requirements (1) to (3). It is inferred that a higher energy of an excited state is more likely to cause bond cleavage, thereby increasing the degree of deterioration via an excited state. In the case where a blue-light-emitting dopant material is used, the energy of the lowest excited singlet state S1 is high, and the energy of a higher excited triplet state Tn generated by energy transfer is also high. So, in particular, the deterioration via an excited state is a problem. According to aspects of the present invention, deterioration via an excited state is inhibited. Thus, in particular, for a device including a light-emitting layer that contains a blue-light-emitting dopant material, the present invention is effective. With respect to a light-emitting dopant, for a phosphorescent dopant, the lifetime of the lowest excited triplet state T1 is short. It is thus inferred that the energy of the lowest excited triplet state T1 of the host material contained in the light-emitting layer is rapidly transferred to the phosphorescent dopant. So, in the case where the light-emitting dopant material is a phosphorescent dopant, the present invention may be less effective because the present invention mainly inhibits the deterioration via an excited state of the host material contained in the light-emitting layer. Meanwhile, for a device including a light-emitting layer that contains a blue-fluorescent dopant material, the present invention is particularly effective.

As described above, according to aspects of the present invention, meeting all requirements (1) to (4) makes it possible to maximally inhibit the deterioration via an excited state.

According to aspects of the present invention, the incorporation of the blue-fluorescent dopant material allows the region where holes and electrons recombine in the light-emitting layer to shift to one side, as described above. In addition, according to aspects of the present invention, the requirement for the lowest excited triplet state T1 is imposed on the host material and the layer which is adjacent to the light-emitting layer and which is located near the recombination region. The requirement for the molecular structure resistant to the deterioration via an excited state is imposed on the blue-fluorescent dopant. So, the lowest excited triplet state, which is a factor that causes the deterioration via an excited state, is dispersed effectively and reliably. Furthermore, the materials used are resistant to the deterioration via an excited state. This makes it possible to maximally inhibit the deterioration via an excited state as a whole. Here, even if the lowest excited triplet state is dispersed effectively and assuredly in the host material and a layer which is adjacent to the light-emitting layer and which is located near the anode, in place of the host material and the layer which is adjacent to the light-emitting layer and which is located near the cathode, it is also possible to maximally inhibit the deterioration via an excited state.

So, according to aspects of the present invention, by meeting all requirements (1a) to (3a) described below and requirement (4) described above in place of requirements (1) to (3), the requirements are functionally related to each other. This makes it possible to maximally inhibit the deterioration via an excited state and to provide an organic light-emitting device having a long continuous operation lifetime.

(1a) According to aspects of the present invention, an organic light-emitting device includes a pair of electrodes having an anode and a cathode, a light-emitting layer arranged between the pair of electrodes, and an electron-blocking layer adjacent to the light-emitting layer, the light-emitting layer containing a host material and a dopant material having the ability to trap holes.

(2a) According to aspects of the present invention, the energy of the lowest excited triplet state of the electron-blocking layer is set to an energy 0.1 eV lower than that of the host material.

(3a) According to aspects of the present invention, the host material and a material for the electron-blocking layer are hydrocarbon compounds, each of the hydrocarbon compounds having a plurality of mono- or higher-valent aromatic hydrocarbon moieties each optionally substituted with an alkyl group, and the aromatic hydrocarbon moieties being linked together only by a single bond. A substructure containing the single bond and the aromatic hydrocarbon moieties linked together by the single bond is represented only by general formula [1] or [2] described above.

(4) The dopant material according to aspects of the present invention is a blue-fluorescent dopant material.

In requirement (1a) according to aspects of the present invention, the term "dopant having the ability to trap holes" indicates a dopant that effectively traps holes but does not trap electrons in the light-emitting layer. The dopant having the ability to trap holes has the effect of allowing a region where holes and electrons recombine in the light-emitting layer to shift to a portion of the light-emitting layer near the anode. In the case where the recombination region shift to the anode side of the light-emitting layer as described above, the possible leakage of electrons to a layer which is adjacent to the light-emitting layer and which is located near the anode needs to be eliminated. To prevent the leakage of electrons from the light-emitting layer to a layer adjacent to the anode and to allow the recombination region of holes and electrons injected from both electrodes to be located in the light-emitting layer, the layer adjacent to the light-emitting layer and near the anode serves as the electron-blocking layer. In requirement (1a), the materials contained in the organic layers that undergo the deterioration via an excited state are the host material and a material contained in the electron-blocking layer adjacent to the light-emitting layer, the electron-blocking layer being located near the region where holes and electrons recombine, provided that requirement (2a) is met. In requirement (1a), the region where holes and electrons recombine is located in the portion of the light-emitting layer near the anode, thus reducing the degree of deterioration via an excited state of the layer which is adjacent to the light-emitting layer and which is located near the cathode.

With respect to requirement (2a), in the case where requirement (1a) is met, the energy of the lowest excited triplet state T1 is assuredly transferred from the host material contained in the light-emitting layer to the electron-blocking layer for the same reason as in requirement (2).

Meeting requirement (3a) permits the host material contained in the light-emitting layer and the material contained in the electron-blocking layer to have higher resistance to the deterioration via an excited state. Meeting requirements (1a) and (2a) makes it possible to disperse the lowest excited triplet state T1 over the host material contained in the light-emitting layer and the electron-blocking layer adjacent to the light-emitting layer. If, however, requirement (3a) is not met, the degrees of deterioration via an excited state of the host material contained in the light-emitting layer and the material contained in the electron-blocking layer are increased, which is an opposite effect.

According to aspects of the present invention, meeting requirement (5) in addition to requirements (1) to (4) described above makes it possible to further inhibit the deterioration via an excited state and further improve the performance of the organic light-emitting device.

(5) The minimum exposed surface area of the single bond between aromatic hydrocarbon moieties of each of the host material contained in the light-emitting layer and the material contained in the hole-blocking layer is higher than 87.

Furthermore, according to aspects of the present invention, meeting requirement (5a) in addition to requirements (1a) to (3a) and (4) described above makes it possible to further inhibit the deterioration via an excited state and further improve the performance of the organic light-emitting device.

(5a) The minimum exposed surface area of the single bond between aromatic hydrocarbon moieties of each of the host material contained in the light-emitting layer and the material contained in the electron-blocking layer is higher than 87.

According to aspects of the present invention, in the case where a material containing a fluoranthene skeleton is used as a substructure of the blue-fluorescent dopant material, a blue-light-emitting dopant material having the ability to trap electrons is provided effectively and easily. This is because the presence of the fluoranthene skeleton as a substructure generally results in a low energy of the lowest unoccupied molecular orbital (LUMO), compared with six-membered fused polycyclic aromatic hydrocarbon skeletons. According to aspects of the present invention, a larger number of the fluoranthene skeletons contained in the substructure of the blue-fluorescent dopant material can lead to a lower energy of the LUMO.

Furthermore, the blue-fluorescent dopant material according to aspects of the present invention can be a hydrocarbon compound that does not contain an amino group or a C—N single bond between an aromatic hydrocarbon moiety and a heterocycle in its molecule. The blue-fluorescent dopant material is believed to be insensitive to deterioration due to photoexcitation, compared with the host material. If the blue-fluorescent dopant material contains a C—N single bond, bond cleavage may be caused just by excitation to the lowest excited singlet state S1. However, it is necessary to consider the fact that the incorporation of an arylamino group into the substructure of the blue-fluorescent dopant material having the ability to trap holes facilitates the formation of a blue-light-emitting layer that effectively traps only holes.

According to aspects of the present invention, the host material contained in the light-emitting layer can have an energy of the lowest excited triplet state T1 of 2.5 eV or less. This is because the lifetime of the lowest excited triplet state T1 is minimized to minimize the generation of the higher excited triplet state Tn. The light-emitting device according to aspects of the present invention contains the blue-fluorescent dopant material and has the effect of minimizing the energy of the higher excited triplet state Tn to minimize the cleavage of the C—C single bond.

According to aspects of the present invention, the following idea may be used to design the materials in order that the energy of the lowest excited triplet state T1 of the layer adjacent to the light-emitting layer is set to an energy 0.1 eV lower than that of lowest excited triplet state T1 of the host material contained in the light-emitting layer.

That is, the molecular design may be performed in such a manner that the layer adjacent to the light-emitting layer and the host material in the light-emitting layer do not contain the same aromatic hydrocarbon skeleton in which the HOMO and LUMO distributions of the layer adjacent to the light-emitting layer are equal to the HOMO and LUMO distributions of the host material contained in the light-emitting layer.

The reason for this is as follows: According to molecular orbital calculations, in general, the energy level of the lowest excited triplet state T1 of a molecule varies depending on the energy level of the lowest excited singlet state S1, provided that the HOMO and LUMO distributions of the molecule are not drastically changed. So, in the case where the HOMO and LUMO distributions are not very different between two types of molecules, the energy levels of the lowest excited triplet state T1, as well as the energy levels of the lowest excited singlet state S1, tend to be rarely different therebetween.

The concentration of the blue-fluorescent dopant material according to aspects of the present invention is preferably in the range of 0.1% by weight to 35% by weight and more preferably 1% by weight to 15% by weight with respect to the total weight of the host material and the blue-fluorescent dopant material in view of a trapping mechanism and energy transfer from the host material to the blue-light-emitting dopant material.

For the organic light-emitting device according to aspects of the present invention, in the case where the energy of the lowest excited triplet state T1 of the host material contained in the light-emitting layer is transferred to both layers adjacent to the light-emitting layer, the deterioration can be further inhibited.

To this end, it is necessary to meet requirements (6) and (7) in addition to requirements (1) to (4) described above. Alternatively, it is necessary to meet requirements (6a) and (7a) in addition to requirements (1a) to (3a) and (4) described above.

(6) The energy of the lowest excited triplet state of the layer which is adjacent to the light-emitting layer and which is located near the anode is set to an energy 0.1 eV lower than that of the host material.

(7) A material for the layer which is adjacent to the light-emitting layer and which is located near the anode is a hydrocarbon compound having a plurality of mono- or higher-valent aromatic hydrocarbon moieties each optionally substituted with an alkyl group, and the aromatic hydrocarbon moieties being linked together only by a single bond. A substructure containing the single bond and the aromatic hydrocarbon moieties linked together by the single bond is represented only by general formula [1] or [2] described above.

(6a) The energy of the lowest excited triplet state of the layer which is adjacent to the light-emitting layer and which is located near the cathode is set to an energy 0.1 eV lower than that of the host material.

A material for the layer which is adjacent to the light-emitting layer and which is located near the cathode is a hydrocarbon compound having a plurality of mono- or higher-valent aromatic hydrocarbon moieties each optionally substituted with an alkyl group, and the aromatic hydrocarbon moieties being linked together only by a single bond. A substructure containing the single bond and the aromatic hydrocarbon moieties linked together by the single bond is represented only by general formula [1] or [2] described above.

In the case where the organic light-emitting device according to aspects of the present invention meets requirements (1) to (7) described above and also meet requirement (8), the deterioration is still further inhibited.

(8) The minimum exposed surface area of the single bond between aromatic hydrocarbon moieties of the layer which is adjacent to the light-emitting layer and which is located near the anode is higher than 87.

Alternatively, in the case where the organic light-emitting device according to aspects of the present invention meets requirements (1a) to (3a), (4), and (5a) to (7a) and also meets requirement (8a), the deterioration is still further inhibited.

(8a) The minimum exposed surface area of the single bond between aromatic hydrocarbon moieties of the layer which is adjacent to the light-emitting layer and which is located near the cathode is higher than 87.

The color of blue-light emission according to aspects of the present invention is in the range of blue, purplish blue, greenish blue, bluish purple, and blue green defined by Kelly on the xy chromaticity coordinates (Kelly K. L., Color Designations for Lights, J. Opt. Soc. AM. 33, 627-632 (1943)).

In aspects of the present invention, as described below, the emission spectrum of the dopant material is determined by measuring the photoluminescence of a sample in the form of a solution having a concentration of about $1 \times 10^{-5}$ mol/l.

In aspects of the present invention, the electron-trapping ability of the blue-fluorescent dopant material is obtained by meeting the expressions:

|LUMO(dopant)|−|LUMO(host)|>0.15 eV, and

|HOMO(host)|<|HOMO(dopant)|, where LUMO (dopant) represents the energy of the lowest unoccupied molecular orbital of the blue-fluorescent dopant material, LUMO (host) represents the energy of the lowest unoccupied molecular orbital of the host material contained in the light-emitting layer, HOMO (host) represents the energy of the highest occupied molecular orbital of the host material, and HOMO (dopant) represents the energy of the HOMO of the blue-fluorescent dopant material. In the case where the requirements are met, the blue-fluorescent dopant material in the light-emitting layer effectively traps electrons and does not trap holes. That is, it is possible to produce the light-emitting layer that traps only electrons.

In aspects of the present invention, the hole-blocking layer adjacent to the light-emitting layer meets the expression:

|HOMO(host)|<..HOMO(HBL)|, where HOMO (host) represents the energy of the highest occupied molecular orbital of the host material in the light-emitting layer, and HOMO (HBL) represents the energy of the highest occupied molecular orbital of the hole-blocking layer.

In aspects of the present invention, the hole-trapping ability of the blue-fluorescent dopant material is obtained by meeting the expressions:

|LUMO(host)|>|LUMO(dopant)|, and

|HOMO(host)|−|HOMO(dopant)|>0.15 eV.

In the case where the requirements are met, the blue-fluorescent dopant material in the light-emitting layer effectively traps holes and does not trap electrons. That is, it is possible to produce the light-emitting layer that traps only holes.

In aspects of the present invention, the electron-blocking layer adjacent to the light-emitting layer meets the expression:

|LUMO(host)|>|LUMO(EBL)| where LUMO (host) represents the energy of the lowest unoccupied molecular orbital of the host material contained in the light-emitting layer, and LUMO (EBL) represents the energy of the lowest unoccupied molecular orbital of the electron-blocking layer.

Examples of the alkyl group that can be attached to the host material, a hole-blocking material, and an electron-blocking material according to aspects of the present invention include, but are not limited to, a methyl group, a methyl-$d_1$ group, a methyl-$d_3$ group, an ethyl group, an ethyl-$d_5$ group, a n-propyl group, a n-butyl group, a n-pentyl group, a n-hexyl group, a n-heptyl group, a n-octyl group, a n-decyl group, an isopropyl group, an isopropyl-$d_7$ group, an isobutyl group, a sec-butyl group, a tert-butyl group, a tert-butyl-$d_9$ group, an isopentyl group, a neopentyl group, and a tert-octyl group.

Examples of the aromatic hydrocarbon moiety that can be used in the host material, the hole-blocking material, and the electron-blocking material according to aspects of the present invention include, but are not limited to, benzene, naphthalene, anthracene, triphenylene, phenanthrene, pyrene, dibenzo[f,j]picene, chrysene, benzo[e]pyrene, benzo[g]chrysene, benzo[c]phenanthrene, dibenzo[fgop]anthracene, dibenzo[a,c]anthracene, picene, dibenzo[g,p]chrysene, dibenzo[hi,uv]hexacene, benzo[a]anthracene, benzo[ghi]perylene, benzo[c]chrysene, tribenzo[a,c,h]anthracene, naphtho[2,3-h]pentaphene, benzo[b]chrysene, dibenzo[a,h]anthracene, dibenzo[c,g]chrysene, dibenzo[a,i]anthracene, dibenzo[c,g] phenanthrene, dibenzo[ij,no]tetraphene, benzo[s]picene, 9,9-dimethyl-9H-fluorene, 13,13-dimethyl-13H-dibenzo[a,g]fluorene, 7,7-dimethyl-7H-dibenzo[b,g]fluorene, 7,7-dimethyl-7H-dibenzo[c,g]fluorene, fluoranthene, benzo[k]fluoranthene, benzo[e]acephenanthrylene, and naphtho[2,3-e]phenanthrylene.

Examples of the substructure according to aspects of the present invention includes substructures in which the substructures represented by general formula [1] and [2] are substituted with an alkyl group and an aromatic ring, provided that the specified H atoms in the general formulae are not substituted; substructures in which the substructures represented by general formula [1] and [2] are fused to rings; and substructures in which the ring-fused substructures are substituted with an alkyl group and an aromatic ring, provided that the substructure containing a new single bond formed by substitution of the aromatic ring and the aromatic hydrocarbon moiety linked with the aromatic ring is represented only by general formula [1] or [2].

According to aspects of the present invention, the substructure contained in the host material, the hole-blocking material, and the electron-blocking material is represented by general formula [1] or [2]. In general formula [1] or [2], an alkyl group or an aromatic ring may be substituted for a H atom except the specified H atoms. In general formula [1] or [2], a ring may be fused to any position except positions where the specified H atoms are attached. Furthermore, the ring-fused substructure may be further substituted with an alkyl group or an aromatic ring. However, the substructure containing a new single bond formed by substitution of the aromatic ring and the aromatic hydrocarbon moiety linked with the aromatic ring is represented only by general formula [1] or [2].

According to aspects of the present invention, non-limiting examples of the single bond-containing substructure of general formula [1] are represented by structural formulae below.

[Chem. 14]

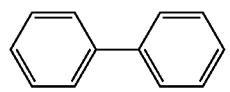
Bond 1-1

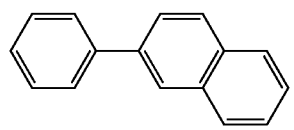
Bond 1-2

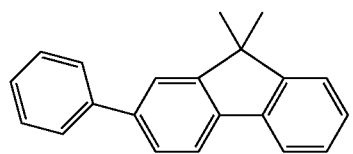
Bond 1-3

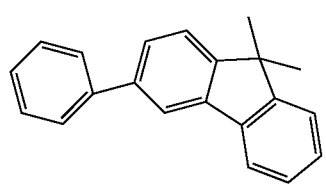
Bond 1-4

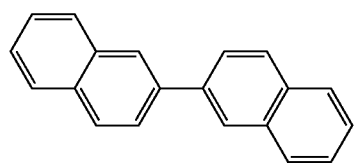
Bond 1-5

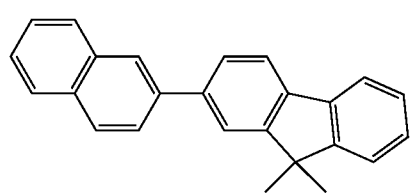
Bond 1-6

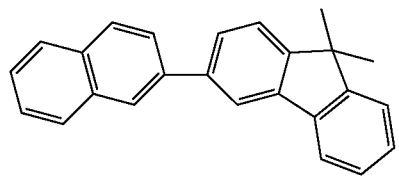
Bond 1-7

-continued

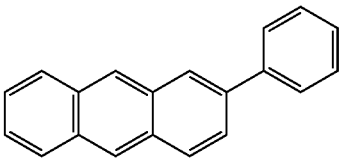
Bond 1-8

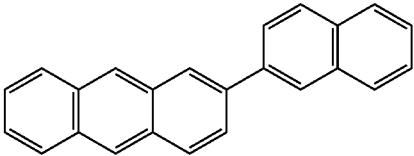
Bond 1-9

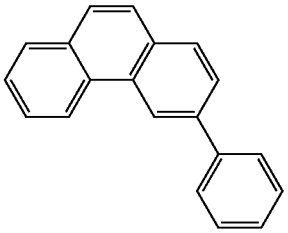
Bond 1-10

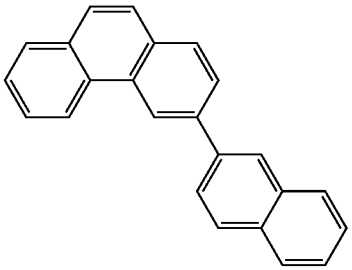
Bond 1-11

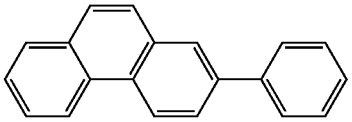
Bond 1-12

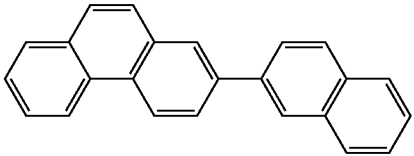
Bond 1-13

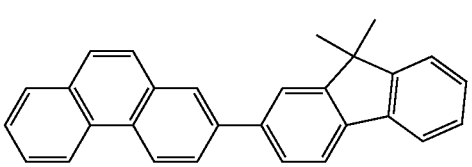
Bond 1-14

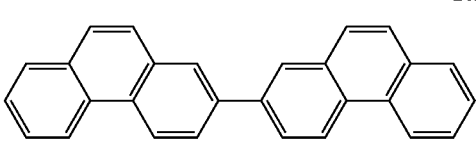
Bond 1-15

Bond 1-16
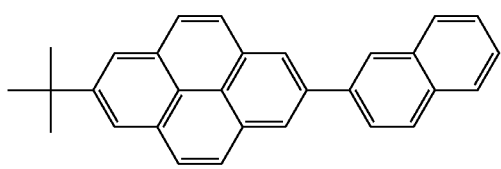
Bond 1-17
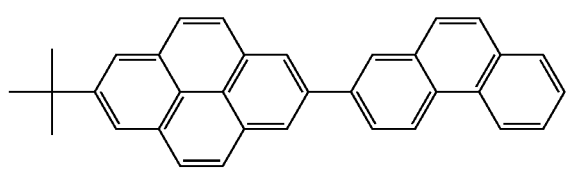
Bond 1-18
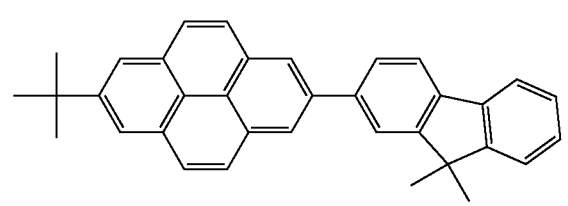
Bond 1-19
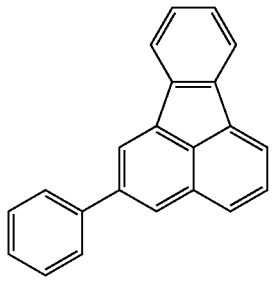
Bond 1-20
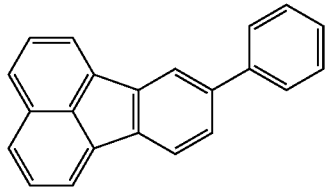
According to aspects of the present invention, non-limiting examples of the single bond-containing substructure of general formula [2] are represented by structural formulae below.
[Chem. 15]
Bond 2-1
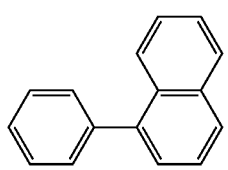
Bond 2-2
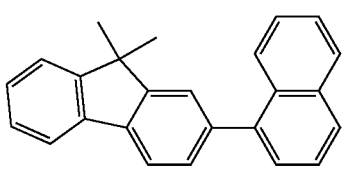
Bond 2-3
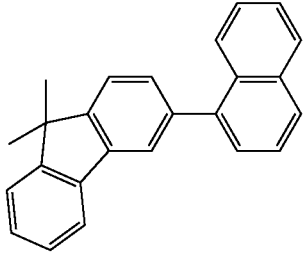
Bond 2-4
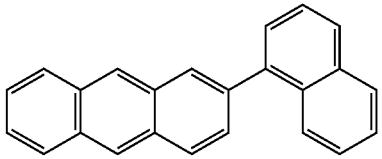
Bond 2-5
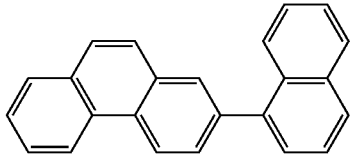
Bond 2-6
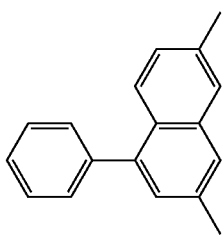
Bond 2-7
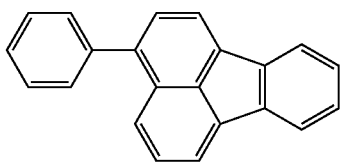
Bond 2-8
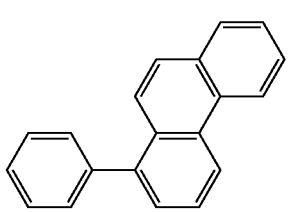
Bond 2-9
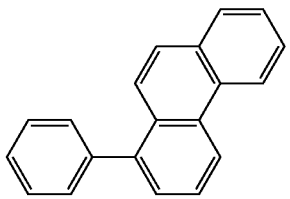

Bond 2-10

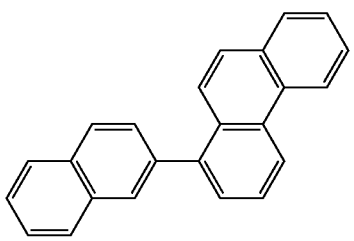

Bond 2-11

Bond 2-12

Bond 2-13

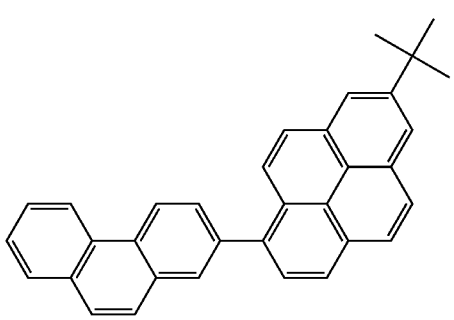

Bond 2-14

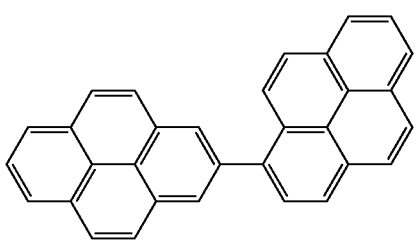

Bond 2-15

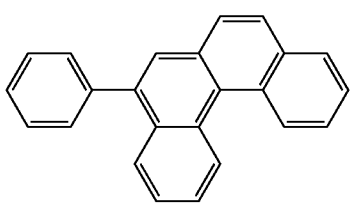

Bond 2-16

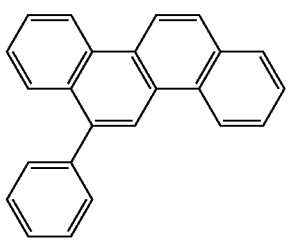

Thus, according to aspects of the present invention, the host material in the light-emitting layer and the material for the layer (the hole-blocking layer or the electron-blocking layer) which is adjacent to the light-emitting layer and to which the energy of the lowest excited triplet state T1 of the host material in the light-emitting layer is transferred have molecular characteristics as described below.

That is, each of the materials is a hydrocarbon compound having a plurality of mono- or higher-valent aromatic hydrocarbon moieties each optionally substituted with an alkyl group, and the aromatic hydrocarbon moieties being linked together only by a single bond.

In addition, each of the materials is a material in which the substructure containing the single bond and the aromatic hydrocarbon moieties linked together by the single bond is not represented by general formulae [3] to [5]. Alternatively, each of the materials is a material in which the substructure containing two single bonds and three aromatic hydrocarbon moieties linked by the two single bonds is not represented by general formulae [6] to [8].

Here, examples of a substructure that is not included in aspects of the present invention include substructures in which the substructures represented by general formulae [3] to [8] are substituted with an alkyl group and an aromatic ring, provided that the specified H atoms in the general formulae are not substituted; substructures in which the substructures represented by general formula [3] to [8] are fused to rings; and substructures in which the ring-fused substructures are substituted with an alkyl group and an aromatic ring.

Here, the substructures that are not included in aspects of the present invention are the substructures represented by general formulae [3] to [8]. In general formulae [3] to [8], an alkyl group or an aromatic ring may be substituted for a H atom except the specified H atoms. In general formulae [3] to [8], a ring may be fused to any position except positions where the specified H atoms are attached. Furthermore, the ring-fused substructure may be further substituted with an alkyl group or an aromatic ring.

Non-limiting examples of the single bond-containing substructure of general formula [3] that is not included in aspects of the present invention are represented by structural formulae below.

[Chem. 16]
Bond 3-1
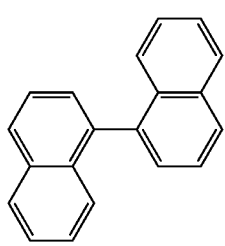
Bond 3-2
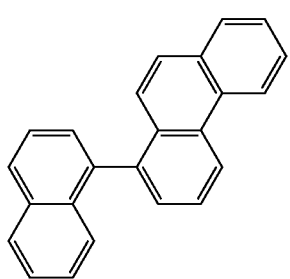
Bond 3-3
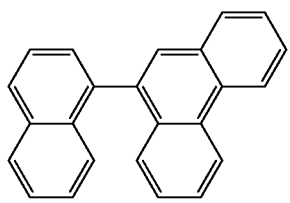
Bond 3-4
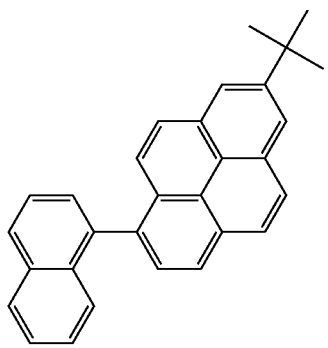
Bond 3-5
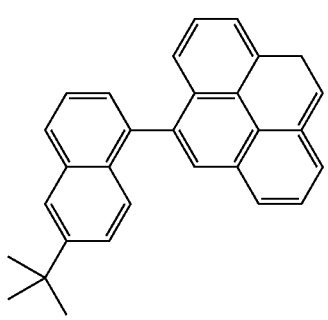
Bond 3-6
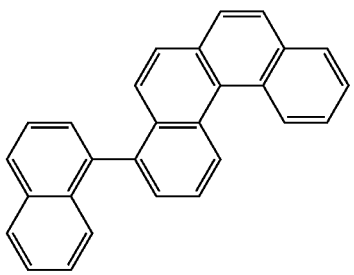
Bond 3-7
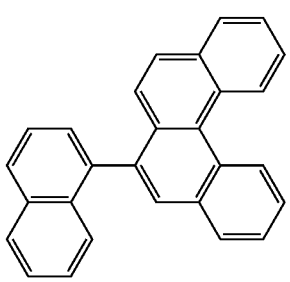
Bond 3-8
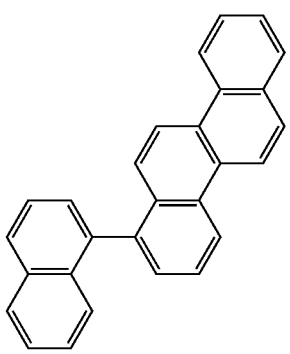
Bond 3-9
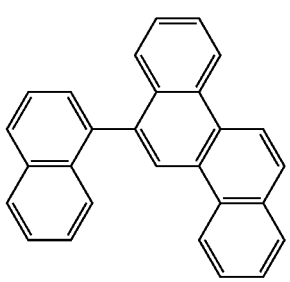
Bond 3-10
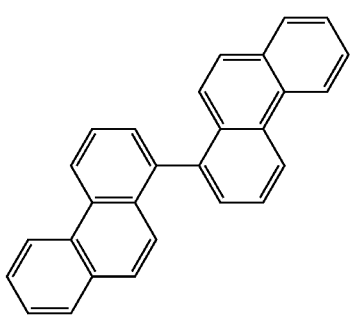

Bond 3-11
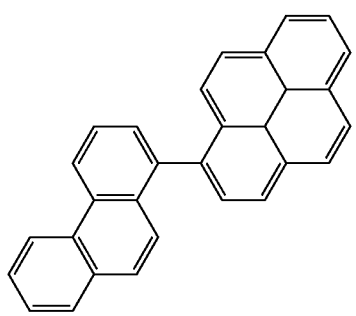
Bond 3-12
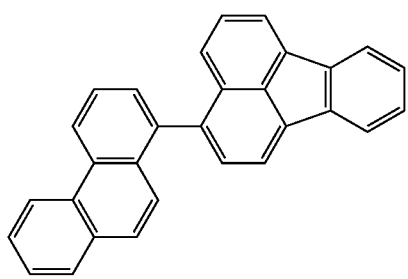
Non-limiting examples of the single bond-containing substructure of general formula [4] that is not included in aspects of the present invention are represented by structural formulae below.
[Chem. 17]
Bond 4-1
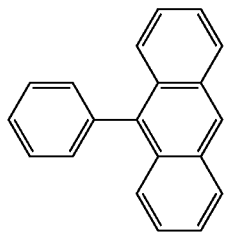
Bond 4-2
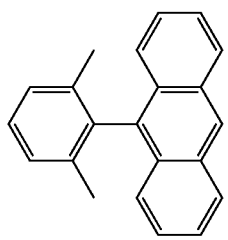
Bond 4-3
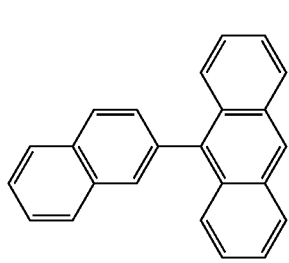
Bond 4-4
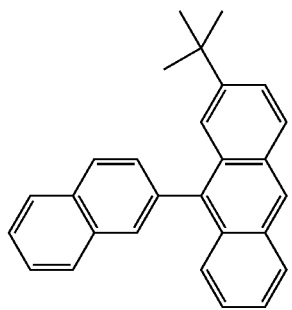
Bond 4-5
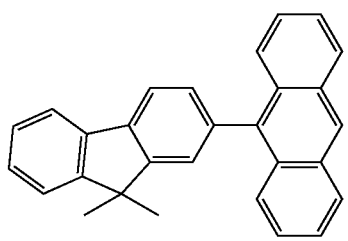
Bond 4-6
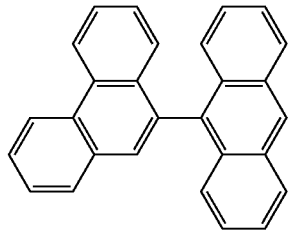
Bond 4-7
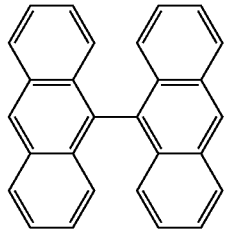
Bond 4-8
Bond 4-9
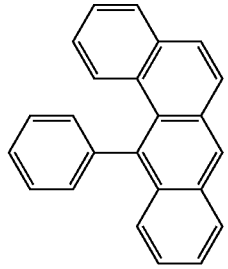

Bond 4-10
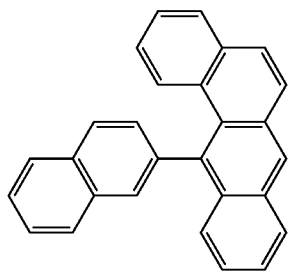
Bond 4-11
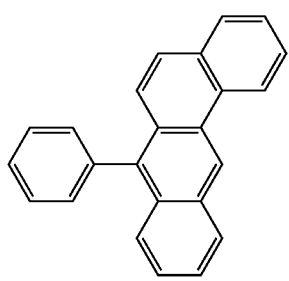
Bond 4-12
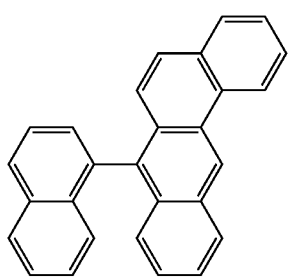
Non-limiting examples of the single bond-containing substructure of general formula [5] that is not included in aspects of the present invention are represented by structural formulae below.
[Chem. 18]
Bond 5-1
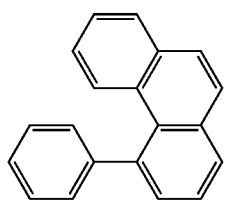
Bond 5-2
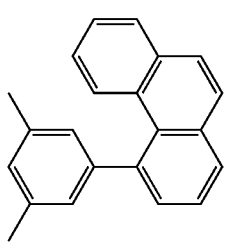
Bond 5-3
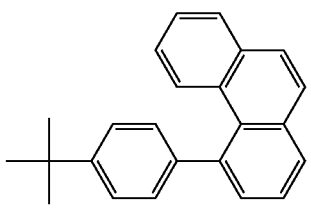
Bond 5-4
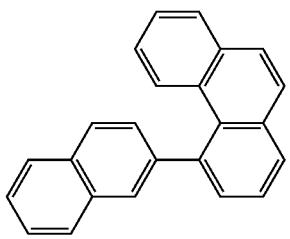
Bond 5-5
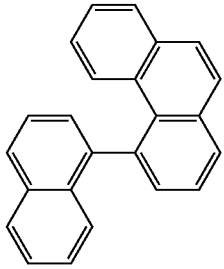
Bond 5-6
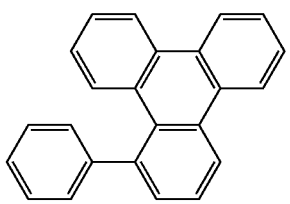
Bond 5-7
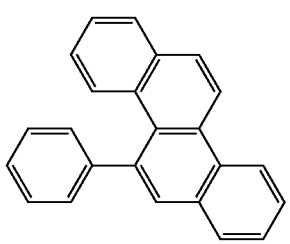
Bond 5-8
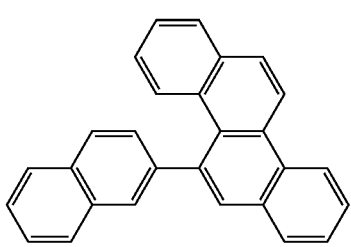

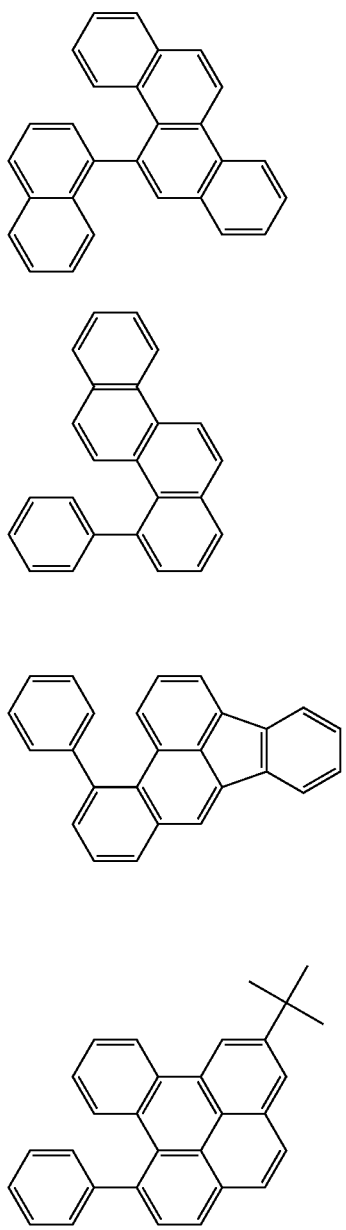
Non-limiting examples of the substructure, which contains two single bonds, of general formula [6] that is not included in aspects of the present invention are represented by structural formulae below.
[Chem. 19]
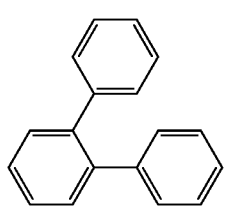
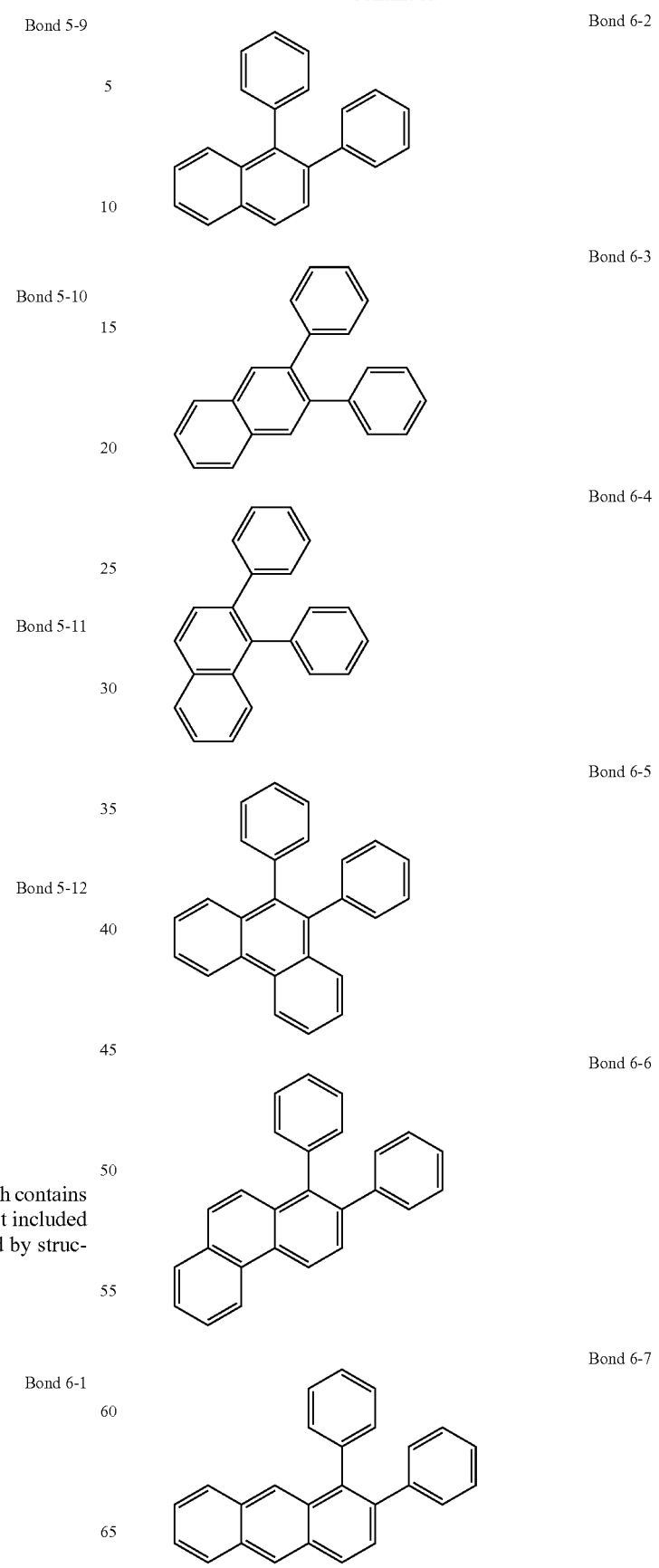

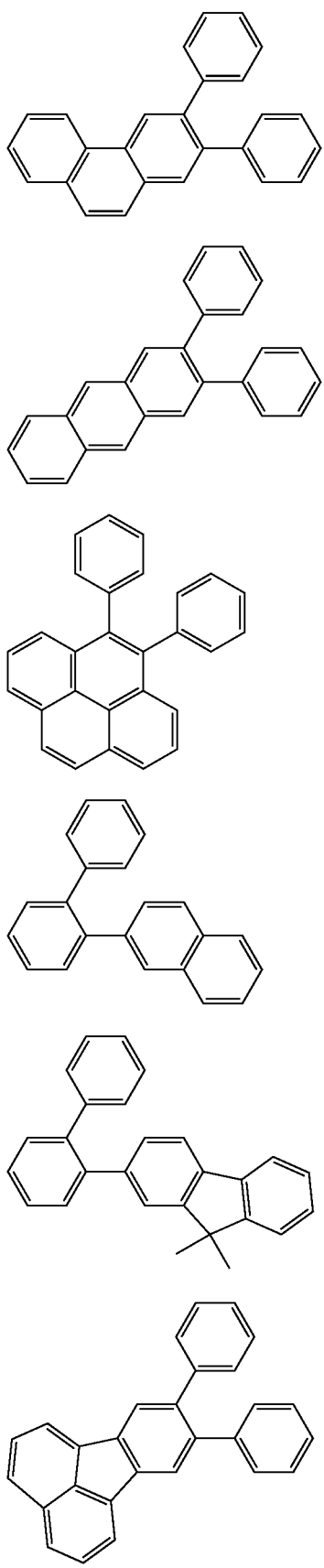
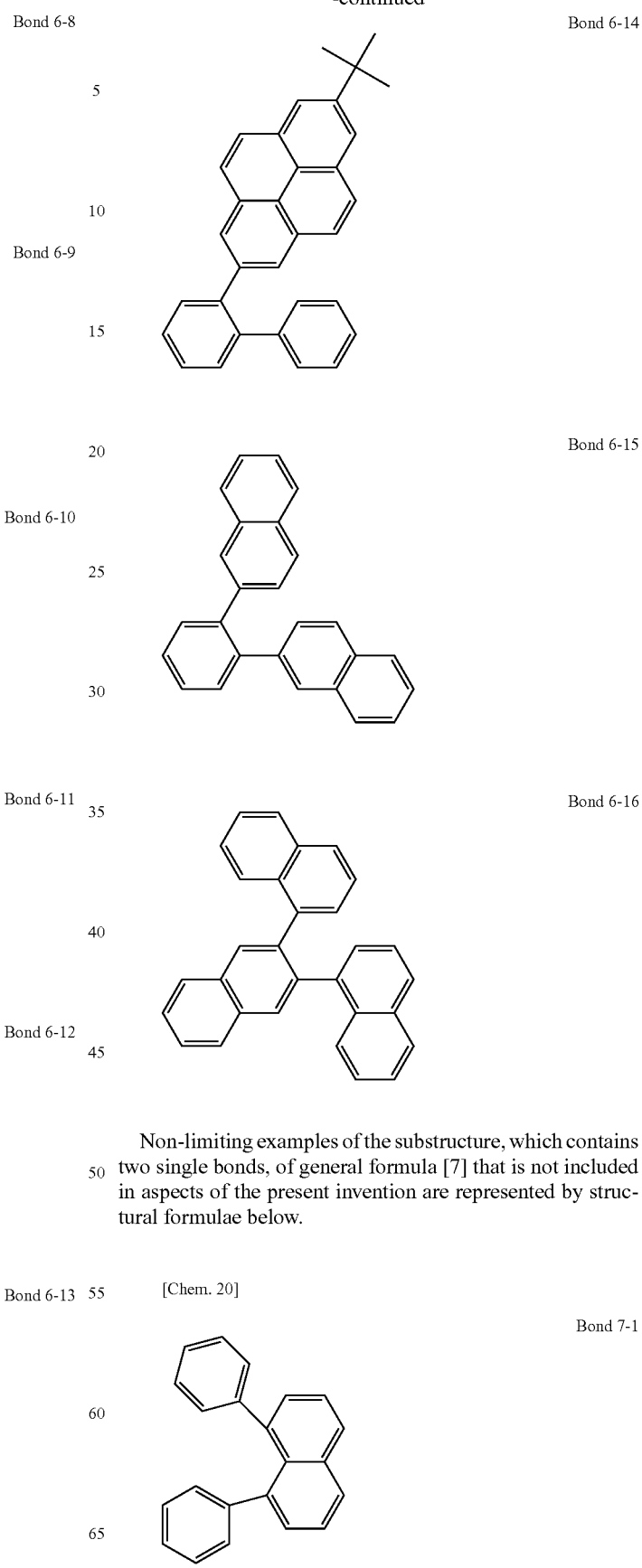
Non-limiting examples of the substructure, which contains two single bonds, of general formula [7] that is not included in aspects of the present invention are represented by structural formulae below.
[Chem. 20]
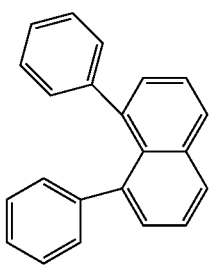
Bond 7-1

Bond 7-2
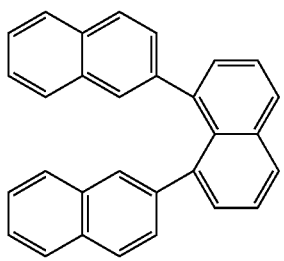
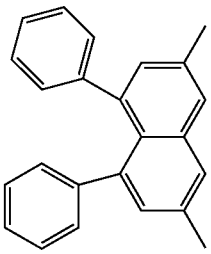
Bond 7-8
Bond 7-3
Non-limiting examples of the substructure, which contains two single bonds, of general formula [8] that is not included in aspects of the present invention are represented by structural formulae below.
[Chem. 21]
Bond 7-4
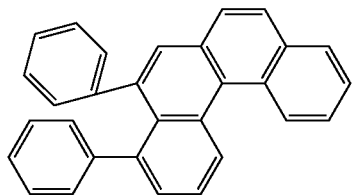
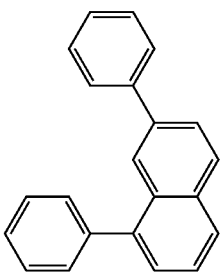
Bond 8-1
Bond 7-5
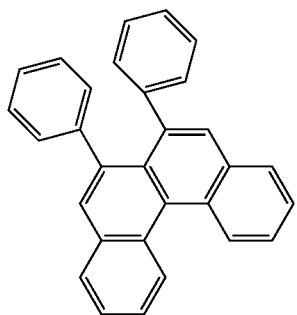
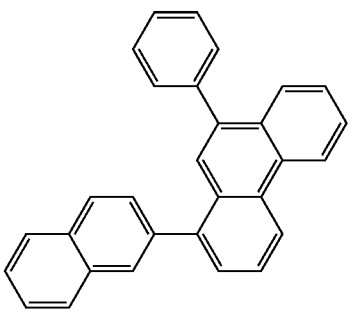
Bond 8-2
Bond 7-6
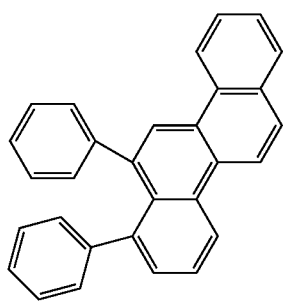
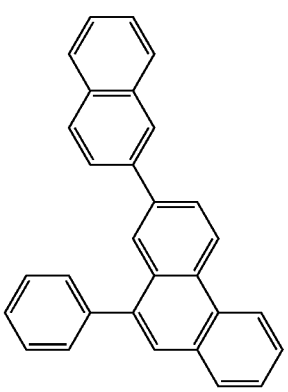
Bond 8-3
Bond 7-7
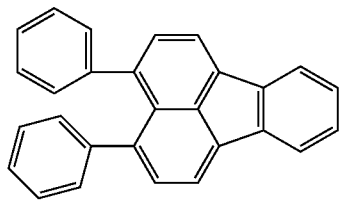

Bond 8-4

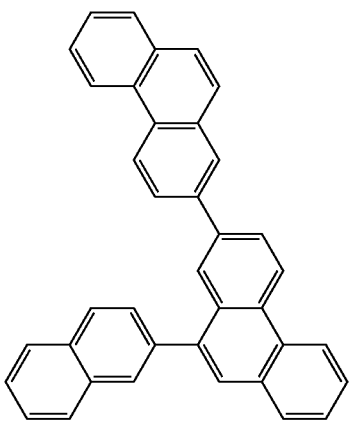

Bond 8-5

Bond 8-6

Bond 8-7

Bond 8-8

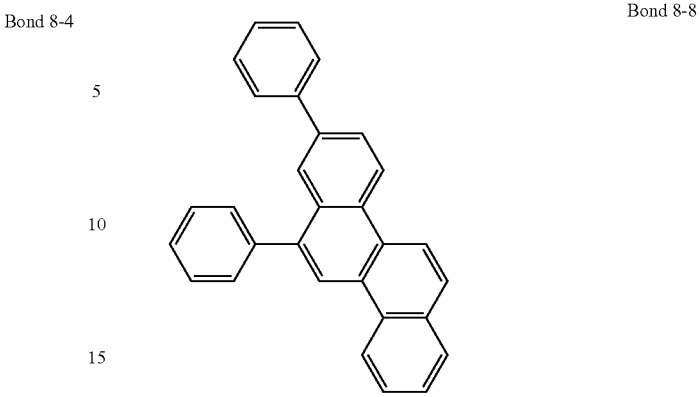

Figure 2:
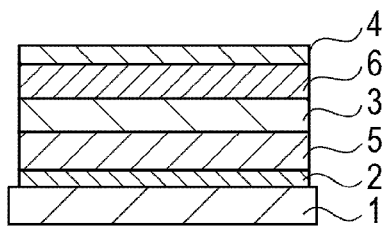
FIG. 2 is a cross-sectional view of an organic light-emitting device according to aspects of the present invention.
Figure 3:
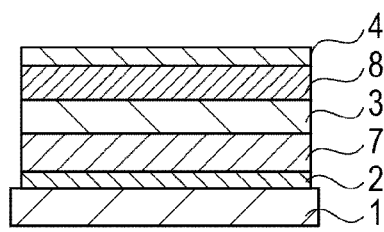
FIG. 3 is a cross-sectional view of an organic light-emitting device according to aspects of the present invention.

FIGS. 2 and 3 illustrate exemplary structures of organic light-emitting devices according to aspects of the present invention. Reference numerals in the figures are described below.

Reference numeral 1 denotes a substrate, reference numeral 2 denotes an anode, reference numeral 3 denotes a light-emitting layer, reference numeral 4 denotes a cathode, reference numeral 5 denotes a hole transport layer, reference numeral 6 denotes a hole-blocking layer, reference numeral 7 denotes an electron-blocking layer, and reference numeral 8 denotes an electron transport layer.

FIG. 2 illustrates a structure in which the anode 2, the hole transport layer 5, the light-emitting layer 3, the hole-blocking layer 6, and the cathode 4 are stacked, in that order, on the substrate 1. In this structure, a carrier-transport function is separated from a light-emitting function. A region where holes and electrons recombine is located in the light-emitting layer. The anode 2 and the cathode 4 are arranged as a pair of electrodes so as to face each other. Materials having hole transport properties, electron transport properties, and light-emitting properties are appropriately combined. High flexibility in the choice of materials is provided. Furthermore, various materials that emit light beams with different emission wavelengths may be used. So, various hues of light emitted can be made. Moreover, it is possible to effectively confine a carrier or excitons in the light-emitting layer 3 to improve the luminous efficiency. The light-emitting layer 3 contains the host material and the blue-fluorescent dopant material having the ability to trap electrons. This allows the recombination region of holes and electrons to shift to a portion of the light-emitting layer adjacent to the cathode. The hole-blocking layer 6 is composed of a material having a low energy of the HOMO (a small absolute value of the ionization potential), thereby preventing the leakage of holes from the light-emitting layer to the layer adjacent to the cathode. This structure is effective in improving the luminous efficiency.

For the structure illustrated in FIG. 2, a hole injection layer, which is a type of hole transport layer, may be interposed between the anode 2 and the hole transport layer 5. This is effective in improving the adhesion between the anode 2 and the hole transport layer 5 or improving the hole injection properties, thereby effectively reducing a voltage.

For the structure illustrated in FIG. 2, an electron transport layer may be interposed between the hole-blocking layer 6 and the cathode 4. For the structure illustrated in FIG. 2, an electron injection layer, which is a type of electron transport layer, may be interposed between the cathode 4 and the hole-blocking layer 6. This is effective in improving the adhesion between the cathode 4 and the hole-blocking layer 6 or improving the electron injection properties, thereby effectively reducing a voltage.

FIG. 3 illustrates a structure in which the anode 2, the electron-blocking layer 7, the light-emitting layer 3, the electron transport layer 8, and the cathode 4 are stacked, in that order, on the substrate 1. In this structure, a carrier-transport function is separated from a light-emitting function. A region where holes and electrons recombine is located in the light-emitting layer. Materials having hole transport properties, electron transport properties, and light-emitting properties are appropriately combined. High flexibility in the choice of materials is provided. Furthermore, various materials that emit light beams with different emission wavelengths may be used. So, various hues of light emitted can be made. Moreover, it is possible to effectively confine a carrier or excitons in the light-emitting layer 3 to improve the luminous efficiency. The light-emitting layer 3 contains the host material and the blue-fluorescent dopant material having the ability to trap holes. This allows the recombination region of holes and electrons to shift to a portion of the light-emitting layer adjacent to the anode. The hole-blocking layer 6 is composed of a material having a high energy of the LUMO (a small absolute value of the electron affinity), thereby preventing the leakage of electrons from the light-emitting layer to the layer adjacent to the anode. This structure is effective in improving the luminous efficiency.

For the structure illustrated in FIG. 3, a hole transport layer may be interposed between the electron-blocking layer 7 and the anode 2. For the structure illustrated in FIG. 3, a hole injection layer, which is a type of hole transport layer, may be interposed between the anode 2 and the electron-blocking layer 7. This is effective in improving the adhesion between the anode 2 and the electron-blocking layer 7 or improving the hole injection properties, thereby effectively reducing a voltage.

For the structure illustrated in FIG. 3, an electron injection layer, which is a type of electron transport layer, may be interposed between the cathode 4 and the electron transport layer 8. This is effective in improving the adhesion between the cathode 4 and the electron transport layer 8 or improving the electron injection properties, thereby effectively reducing a voltage.

The energy of the lowest excited singlet state (energy gap) may be determined from a visible light-ultraviolet absorption spectrum. In aspects of the present invention, the energy of the lowest excited singlet state was determined from an absorption edge of a thin film formed on a glass substrate using a spectrophotometer U-3010 manufactured by Hitachi, Ltd.

With respect to the energy of a highest occupied molecular orbital (HOMO), an ionization potential was measured by photoelectron spectroscopy in air (trade name: AC-1, manufactured by Rikenkiki Co., Ltd).

The energy of a lowest unoccupied molecular orbital (LUMO) can be calculated from the measured value for the energy gap and the foregoing ionization potential. That is, electron affinity=ionization potential−energy gap.

The emission spectrum of the light emitting material was obtained by measuring photoluminescence with a spectrofluorometer F-4500 manufactured by Hitachi Ltd. According to aspects of the present invention, a sample in the form of a solution having a concentration of about $1 \times 10^{-5}$ mol/l was used for the measurement. As a solvent, toluene or cyclohexane was used.

The energy of a lowest excited triplet state can be determined from the phosphorescence spectrum of a target organic material. Specifically, the phosphorescence spectrum was measured at a low temperature, such as the liquid nitrogen temperature (77 K). The energy of the lowest excited triplet state T1 is determined from a first emission peak (peak observed at the shortest wavelength).

In the case of a material that does not phosphoresce (phosphorescence is too weak to be measured), energy transfer from a triplet sensitizer is used.

In the case where the luminous efficiency of phosphorescence is too low to be measured by the foregoing method, there is a method for determining the energy of a lowest excited triplet state by triplet-triplet energy transfer to an acceptor.

In the case where phosphorescence is not measured, the energy of a lowest excited triplet state can be determined by the following calculation technique using computational chemistry software, such as Turbomole. A structure in a ground state is optimized by calculation by a density functional theory (DFT) using B3 LYP serving as a functional and def2-SV(P) serving as a basis function. Next, in the optimized structure, the (absorption) energy of the lowest excited triplet state is calculated by a time-dependent density-functional theory (TDDFT) using B3 LYP serving as a functional and def2-SV(P) serving as a basis function. The calculations of DFT and TDDFT may be performed using another computational chemistry software program having the same function. The estimate of the energy of the lowest excited triplet state T1 (exp. film) [eV] of a film can be determined from the (absorption) energy of lowest excited triplet state T1 (calc.) [eV] using expression 2 below:

$$T1(exp./exp)=0.4518 \times T1(calc.)+1.3248 \quad \text{expression 2.}$$

According to aspects of the present invention, the exposed surface area is uniquely determined by the following calculation technique.

First, among many conformations, the stable structure of the lowest excited triplet state T1 is determined. Specifically, the most stable structure among optimized structures of conformers is determined by molecular mechanics (MM3) using computational chemistry software, such as Cache. Among many conformations, the most stable structure determined by MM3 is defined as the initial structure. The stable structure of the lowest excited triplet state T1 is determined by the density functional theory (DFT) using computational chemistry software, such as Turbomole. In the DFT, B3 LYP is used as the function, and deft-SV(P) is used as the basis function. The calculations of MM3 and DFT may be performed using another computational chemistry software program having the same function.

Figure 4A:
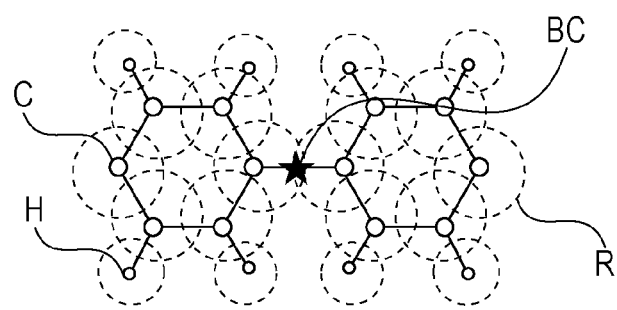
FIGS. 4A to 4C are conceptual views illustrating the details of a method for calculating an exposed surface area according to aspects of the present invention.
Figure 4B:
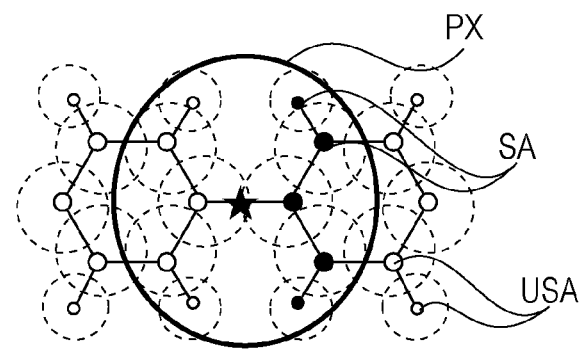
Figure 4C:
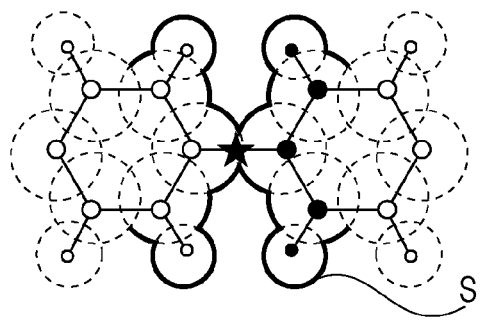

Next, an exposed surface area of a single bond between aromatic hydrocarbon moieties is determined. The exposed surface area of the single bond between aromatic hydrocarbon moieties is determined by selecting atoms located within a fixed distance (proximity=3.0 Å) from the midpoint of the single bond between the aromatic hydrocarbon moieties and calculating the sum of exposed surface areas of the atoms (see FIGS. 4A to 4C). FIG. 4A illustrates an exemplary substructure around the single bond between the aromatic hydrocarbon moieties. In FIG. 4A, BC represents the midpoint of the single bond between the aromatic hydrocarbon moieties. R represents the surface of a sphere having a radius that is determined by adding the van der Waals radius (value by Bondi) and the radius of the probe. C represents a carbon atom. H represents a hydrogen atom. FIG. 4B illustrates a state when the atoms located within 3.0 Å from the midpoint are selected. PX represents a region within 3.0 unit from BC. SA represents atoms that are contained in PX. USA represents atoms that are not contained in PX. FIG. 4C illustrates the exposed surface area of the single bond between the aromatic hydrocarbon moieties. S represents the exposed surface area of the target single bond. For the sake of simplicity, FIGS. 4A to 4C are two-dimensionally illustrated. In fact, however, the exposed surface area is three-dimensionally calculated.

Figure 5A:
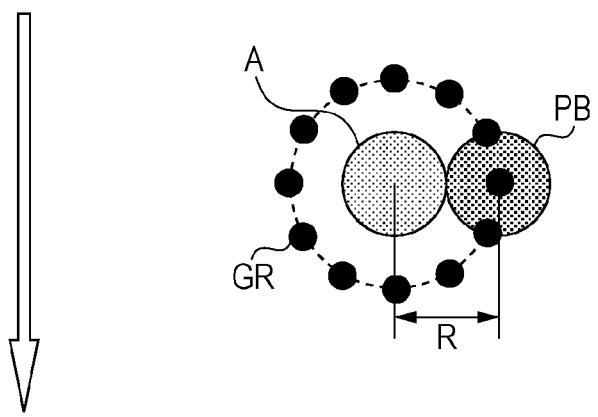
FIGS. 5A and 5B are conceptual views illustrating grid approximation in the method for calculating an exposed surface area according to aspects of the present invention.
Figure 5B:
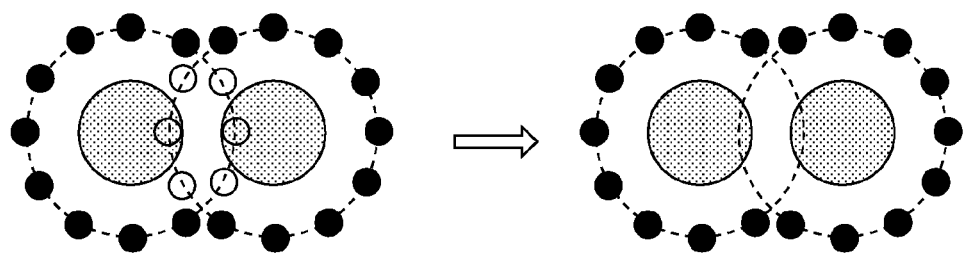

The exposed surface area may indicate the area of a surface defined by plotting the locus of the center of the probe sphere having a probe radius of 1.7 Å. Specifically, it is possible to perform an approximate calculation by generating grid points on the surface of a molecule having a radius determined by adding the van der Waals radius (value by Bondi) and the probe radius, removing grid points located in another atom, and counting the number of the remaining grid points (see FIGS. 5A and 5B). FIG. 5A illustrates a state in which the grid points are generated. FIG. 5B illustrates a state in which the grid points located in another atom are removed. In FIG. 5A, A represents an atom in view of the van der Waals radius. PB represents the probe sphere. GR represents the grind points. R represents a value determined by adding the van der Waals radius and the probe radius. For the sake of simplicity, FIGS. 5A and 5B are two-dimensionally illustrated. In fact, however, the exposed surface area is three-dimensionally calculated.

The grid points are generated as follows: A regular icosahedron inscribed in the sphere having a radius determined by adding the van der Waals radius of each atom and the probe radius is formed. Each face is divided into 25 regular triangles. Vertices of each regular triangle are projected to a circumscribed sphere to form a geodesic dome. Vertices of the geodesic dome are used to generate 252 grid points. The calculation of the exposed surface area according to aspects of the present invention is not limited to the approximation. In the case of approximation, at least 252 grid points can be generated.

After the calculation of the exposed surface area of each single bond, the minimum value is selected.

A hole transport material according to aspects of the present invention can facilitate the injection of holes from the anode and have excellent mobility to transport injected holes to the light-emitting layer. Examples of a low-molecular-weight material and a polymer material having the ability to inject or transport holes include, but are not limited to, triarylamine derivatives, phenylenediamine derivatives, triazole derivatives, oxadiazole derivatives, imidazole derivatives, pyrazoline derivatives, pyrazolone derivatives, oxazole derivatives, fluorenone derivatives, hydrazone derivatives, stilbene derivatives, phthalocyanine derivatives, porphyrin derivatives, poly(vinylcarbazole), poly(silylene), poly(thiophene), and other conductive polymers. A material having a low electron affinity may also be used as an electron-blocking material.

An electron injection/transport material according to aspects of the present invention may be selected from materials each facilitating the injection of electrons from the cathode and having the ability to transport injected electrons to the light-emitting layer. The electron injection/transport material is selected in view of, for example, a balance with the carrier mobility of the hole transport material. Examples of a material having the ability to inject or transport electrons include, but are not limited to, oxadiazole derivatives, oxazole derivatives, thiazole derivatives, thiadiazole derivatives, pyrazine derivatives, triazole derivatives, triazine derivatives, perylene derivatives, quinoline derivatives, quinoxaline derivatives, fluorenone derivatives, anthrone derivatives, phenanthroline derivatives, and organometallic complexes. Furthermore, a material having a high ionization potential may also be used as a hole-blocking material.

Layers, e.g., the light-emitting layer and other organic layers, composed of organic materials of an organic light-emitting device according to aspects of the present invention is formed by various methods. Typically, a thin film is formed by vacuum evaporation, ionized deposition, sputtering, or plasma-enhanced chemical vapor deposition (CVD). Alternatively, a thin film is formed by a known application process (e.g., spin coating, dipping, casting, an LB method, or an inkjet method) with a solution of a material dissolved in an appropriate solvent. In particular, in the case where a film is formed by an application process, the film may be formed in combination with an appropriate binder resin.

The binder resin may be selected from a wide variety of binding resins. Examples thereof include, but are not limited to, polyvinylcarbazole resins, polycarbonate resins, polyester resins, polyarylate resins, polystyrene resins, ABS resins, polybutadiene resins, polyurethane resins, acrylic resins, methacrylic resins, butyral resins, polyvinylacetal resins, polyamide resins, polyimide resins, polyethylene resins, polyethersulfone resins, diallyl phthalate resins, phenolic resins, epoxy resins, silicone resins, polysulfone resins, and urea resins. These may be used separately in the form of a homopolymer or in combination as a mixture in the form of a copolymer. In addition, known additives, such as a plasticizer, an antioxidant, and an ultraviolet absorber, may be used in combination, as needed.

The anode according to aspects of the present invention may be composed of a material having a higher work function. Examples of the material that can be used include elemental metals, such as gold, platinum, silver, copper, nickel, palladium, cobalt, selenium, vanadium, and tungsten; alloys thereof; and metal oxides, such as tin oxide, zinc oxide, indium oxide, indium tin oxide (ITO), and indium zinc oxide. Furthermore, conductive polymers, such as polyaniline, polypyrrole, and polythiophene, may be used. These materials for the electrode may be used alone or in combination. The anode may be formed of a single layer or multiple layers.

The cathode according to aspects of the present invention may be composed of a material having a lower work function. Examples thereof include elemental metals, such as lithium, sodium, potassium, calcium, magnesium, aluminum, indium, ruthenium, titanium, manganese, yttrium, silver, lead, tin, and chromium; alloys, such as lithium-indium, sodium-potassium, magnesium-silver, aluminum-lithium, aluminum-magnesium, and magnesium-indium; and metal oxides, such as indium tin oxide (ITO). These materials for the electrode may be used alone or in combination. The cathode may be formed of a single layer or multiple layers.

In addition, at least one of the anode and the cathode can be transparent or translucent.

Examples of the substrate according to aspects of the present invention include, but are not particularly limited to, opaque substrates, such as metallic substrates and ceramic substrates; and transparent substrates, such as glass substrates, quartz substrates, and plastic sheets. Furthermore, it is also possible to control the emission color using a color filter film, a fluorescent color conversion filter film, a dielectric reflection film, or the like on the substrate.

With respect to the direction of light emission of the device, the organic light-emitting device according to aspects of the present invention may have a bottom-emission structure, in which light emerges from the substrate, or a top-emission structure, in which light emerges from a surface opposite the substrate.

In order to prevent contact with oxygen, water, and so forth, a protective layer or a sealing layer may be arranged on the resulting device. Examples of the protective layer include diamond thin films, inorganic films composed of inorganic substances, such as metal oxides and metal nitride; polymeric films composed of polymers, such as fluorinated resins, poly-p-xylene, polyethylene, silicone resins, and polystyrene resins; and photocurable resins. Furthermore, the device may be covered with, for example, glass, a gas-impermeable film, or a metal, and packaged in an appropriate sealing resin.

The organic light-emitting device according to aspects of the present invention may be used as a pixel of an image display or may be used as an illumination light source. The image display may have the pixel, which is the organic light-emitting device according to aspects of the present invention, and a transistor which is connected to the organic light-emitting device and which controls the emission intensity.

The image display may have plural pixels. The illumination light source may be a light source that emits white light or a light source that emits monochromatic light (e.g., red, blue, or green). The illumination light source may be a light source that emits white light obtained by mixing different colors. In that case, the organic light-emitting device according to aspects of the present invention may emit light of one color of them.

EXAMPLES

While the present invention will be specifically described by examples, the present invention is not limited to these examples.

Synthesis Example

Synthesis examples of compounds 1 to 13 used in Examples 1 to 6 will be described below.

[Chem. 22]

Compound 1

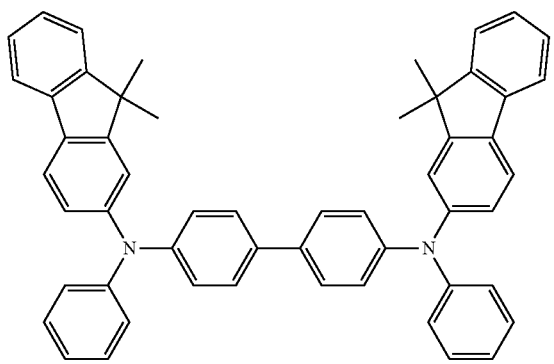

Compound 2

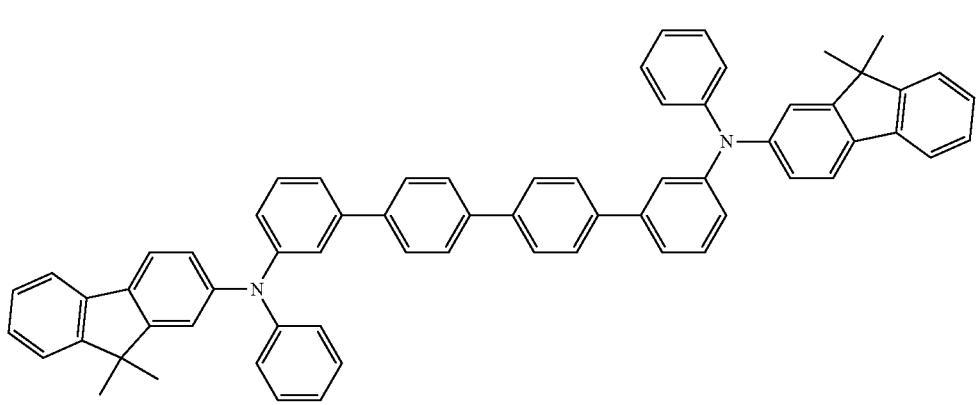

Compound 3

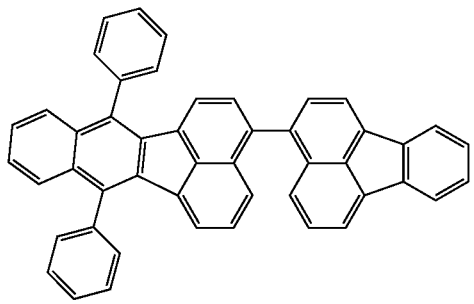

Compound 4

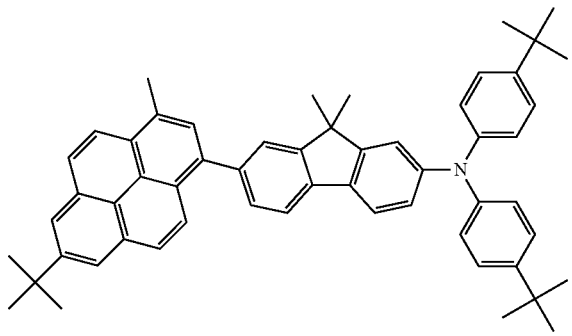

-continued
Compound 5
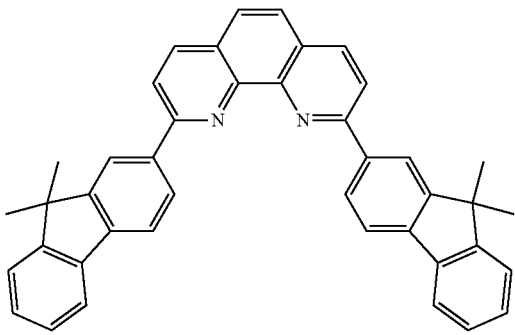
Compound 6
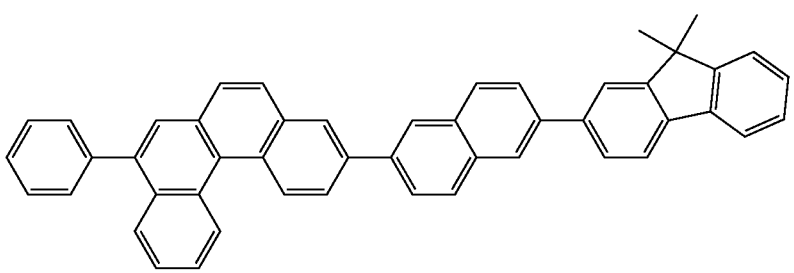
Compound 7
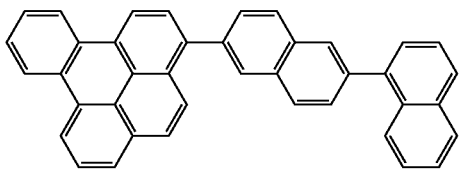
Compound 8
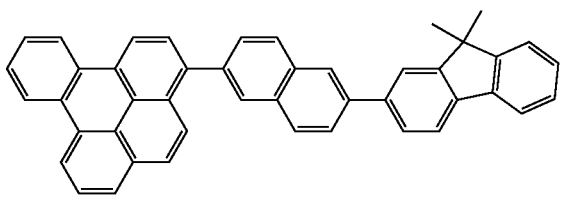
Compound 9
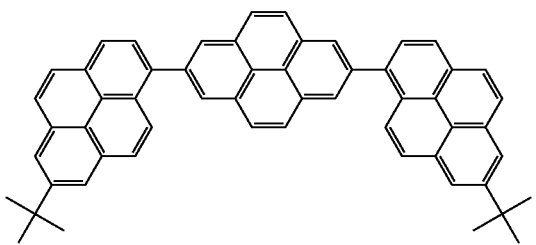
Compound 10
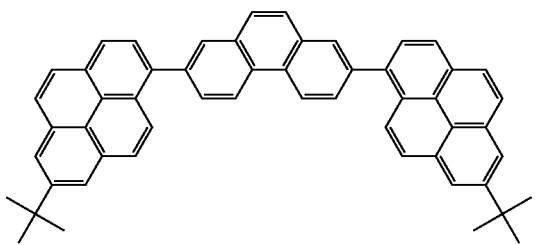
Compound 11
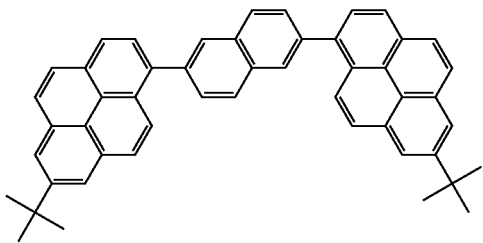
Compound 12
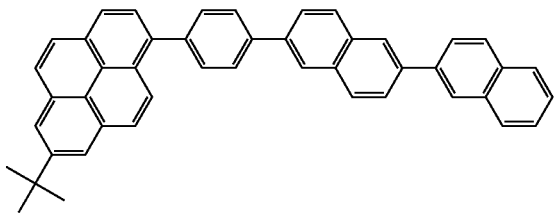

Compound 13

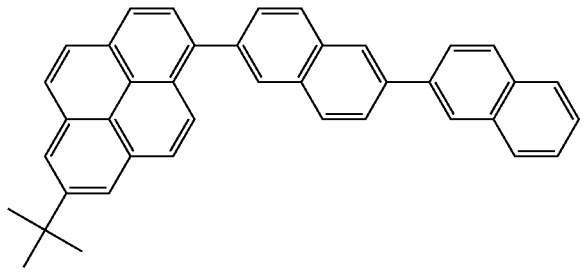

Synthesis Example of Compound 1

N,N'-Diphenylbenzidine (4.88 g (14.5 mmol)), 2-iodo-9,9-dimethylfluorene (6.40 g (20 mmol)), potassium carbonate (4.00 g), a copper powder (3.0 g), and o-dichlorobenzene (30 mL) were fed into a 100-mL recovery flask. The flask was equipped with a condenser. The mixture was refluxed for 20 hours. The reaction mixture was cooled and then filtered. After removal of o-dichlorobenzene by evaporation under reduced pressure, methanol was added thereto to precipitate crude crystals. The crude crystals were recovered by filtration.

The crude crystals were purified by silica gel column chromatography with a toluene/hexane mixed solvent to give 7.32 g (yield: 70%) of compound 1 as white crystals.

Synthesis Example of Compound 2

1) Synthesis of Intermediate 2-1

First, (3-bromophenyl)-(9,9-dimethylfluoren-2-yl)phenylamine (compound 2-1) can be produced from (9,9-dimethylfluoren-2-yl)phenylamine and 3-bromoiodobenzene by the Ullmann reaction.

2) Synthesis of Compound 2

A 300-mL three-necked flask was prepared. A diborate biphenylene intermediate 2-2 (1.8 g (4.4 mmol)) was charged into the flask. Then 3-bromophenyl-(9,9-dimethylfluoren-2-yl)phenylamine [1-1] (4.3 g (9.7 mmol)) was added thereto. Furthermore, toluene (100 mL) and ethanol (50 mL) were added thereto. An aqueous solution of calcium carbonate (12 g)/water (50 mL) was added dropwise thereto in a nitrogen atmosphere at room temperature under stirring. Then tetrakis(triphenylphosphine)palladium(0) (0.25 g (0.22 mmol)) was added thereto. The mixture was stirred at room temperature for 30 minutes, heated to 70° C., and stirred for 9 hours. After the reaction, the organic layer was subjected to extraction

[Chem. 23]

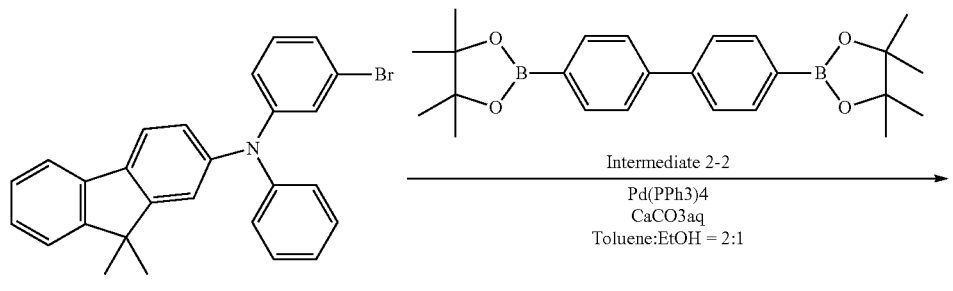

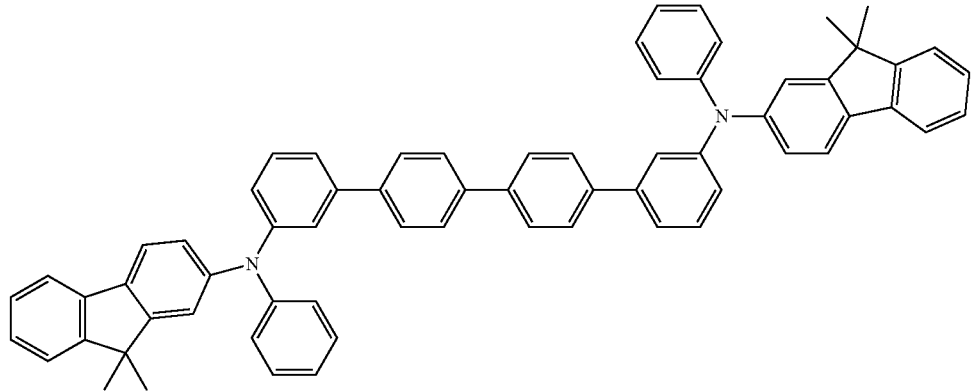

Compound 2 with toluene. The resulting mixture was dried over anhydrous sodium sulfate. The mixture was purified by silica gel column chromatography (eluent: hexane-toluene mixed solvent) to give 1.4 g (yield: 74%) of compound 2 (white crystals). The M+ of this compound, i.e., 872.4, was confirmed by matrix-assisted laser desorption ionization-time-of-flight mass spectrometry (MALDI-TOF MS).

Synthesis Example of Compound 3

[Chem. 24]

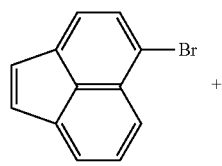

+

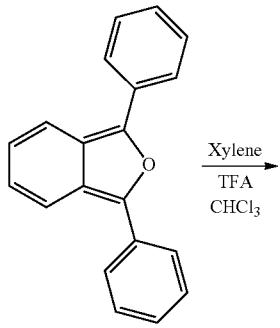

Xylene
TFA
CHCl₃

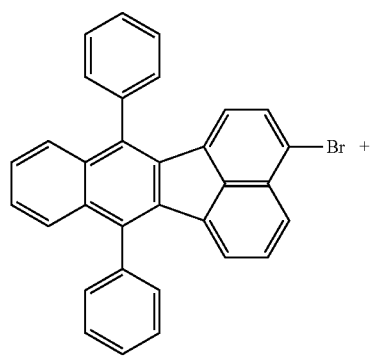

Intermediate 3-1

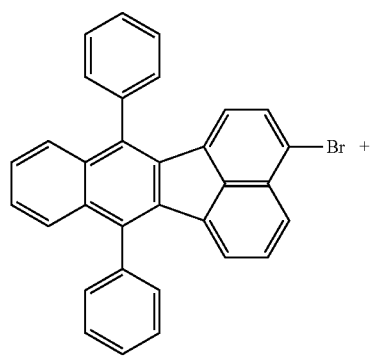

Intermediate 3-1  Br +

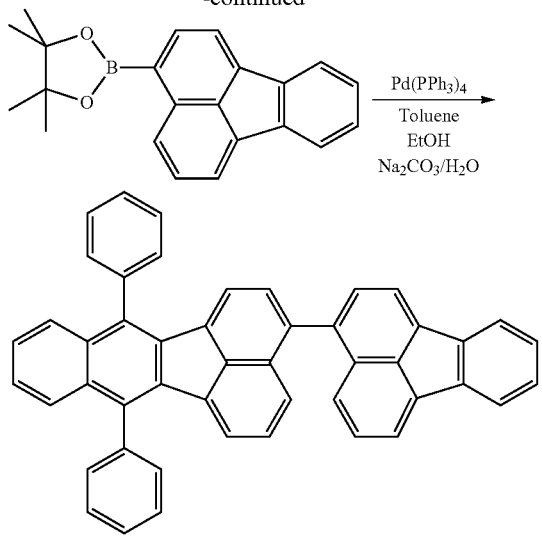

Pd(PPh₃)₄
Toluene
EtOH
Na₂CO₃/H₂O

Compound 3

(1) Synthesis of Intermediate 3-1
Reagents and a solvent were charged into a reaction vessel.
5-Bromoacenaphthylene: 14.5 g (62.8 mmol)
Diphenylisobenzofuran: 17.1 g (63.3 mmol)
Xylene: 200 mL
The reaction solution was stirred for 5 hours at a temperature at which the xylene solvent was refluxed. After the reaction solution was cooled to room temperature, the solvent was removed by evaporation under reduced pressure. Trifluoroacetic anhydride (26 mL) and chloroform (260 mL) were added thereto. The reaction solution was refluxed under stirring for 1 hour. After the reaction solution was cooled to room temperature, the removal of the solvent by evaporation under reduced pressure provided a residue. The residue was purified by silica gel column chromatography (eluent:toluene/heptane=1/3) to give 16 g of 4-bromo-7,12-diphenylbenzo[k]fluoranthene, which is intermediate 3-1, as a yellow solid.
(2) Synthesis of Compound 3
After a reaction vessel was filled with a nitrogen atmosphere, reagents and solvents were charged into the vessel.
4-Bromo-7,12-diphenylbenzo[k]fluoranthene: 0.7 g (1.45 mmol)
2-(Fluoranthen-3-yl)-4,4,5,5-tetramethyl[1,3,2]dioxaborolane: 0.48 g (1.45 mmol)
Toluene: 100 mL
Ethanol: 50 mL
An aqueous solution of cesium carbonate (0.95 g (2.90 mmol)) dissolved in distilled water (15 mL) was added to the reaction solution. The reaction solution was heated to 50° C. and stirred for 30 minutes.
Tetrakis(triphenylphosphine)palladium (0.17 g (0.145 mmol)) was added thereto. The reaction solution was stirred for 5 hours while being heated in a silicone oil bath heated to 90° C. After the reaction solution was cooled to room temperature, water, toluene, and ethyl acetate were added thereto. The organic layer was then separated. The aqueous layer was subjected to extraction twice with a toluene-ethyl acetate mixed solvent. The resulting organic layer was added to the organic layer that had been initially separated. The collected organic layer was washed with brine and dried over sodium sulfate. The solvent in the organic layer was removed under reduced pressure to provide a residue. The residue was purified by silica gel column chromatography (eluent: toluene/ heptane=1/3) to provide crystals. The resulting crystals were dried at 120° C. in vacuo and then purified by sublimation to give 0.6 g of compound 3 as a pale yellow solid.

The M+ of this compound, i.e., 604.7, was confirmed by matrix-assisted laser desorption ionization-time-of-flight mass spectrometry (MALDI-TOF MS).

Figure 6:
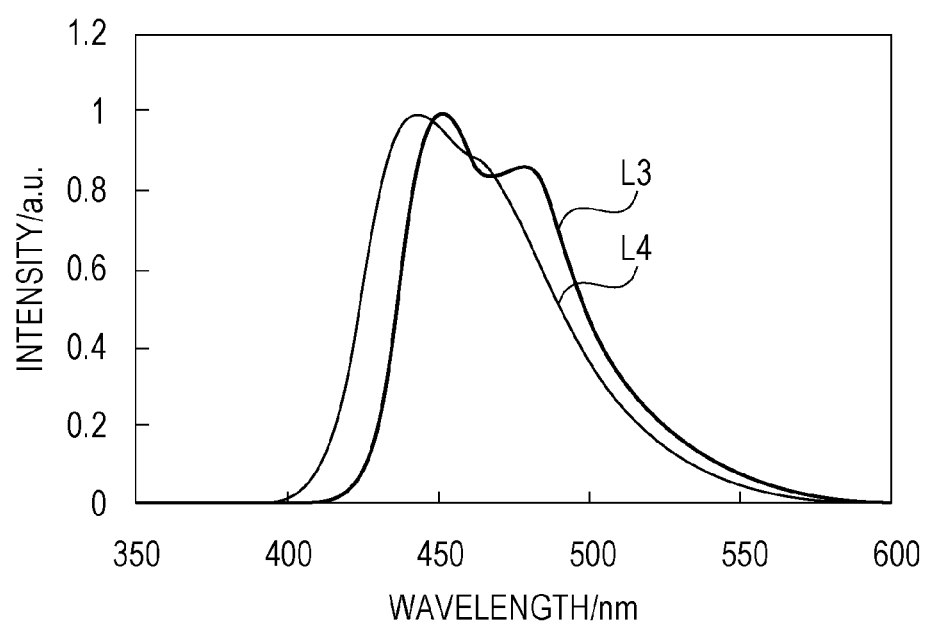
FIG. 6 illustrates emission spectra of compounds 3 and 4 in the form of solutions.

The PL spectrum of a toluene solution containing compound 3 and having a concentration of $1\times10^{-5}$ mol/L was measured with the spectrofluorometer F-4500 (manufactured by Hitachi Ltd.) at an excitation wavelength of 350 nm. A blue-light-emission spectrum having the maximum peak intensity at 451 nm was observed (see L3 in FIG. 6).

Synthesis Example of Compound 4

[Chem.25]

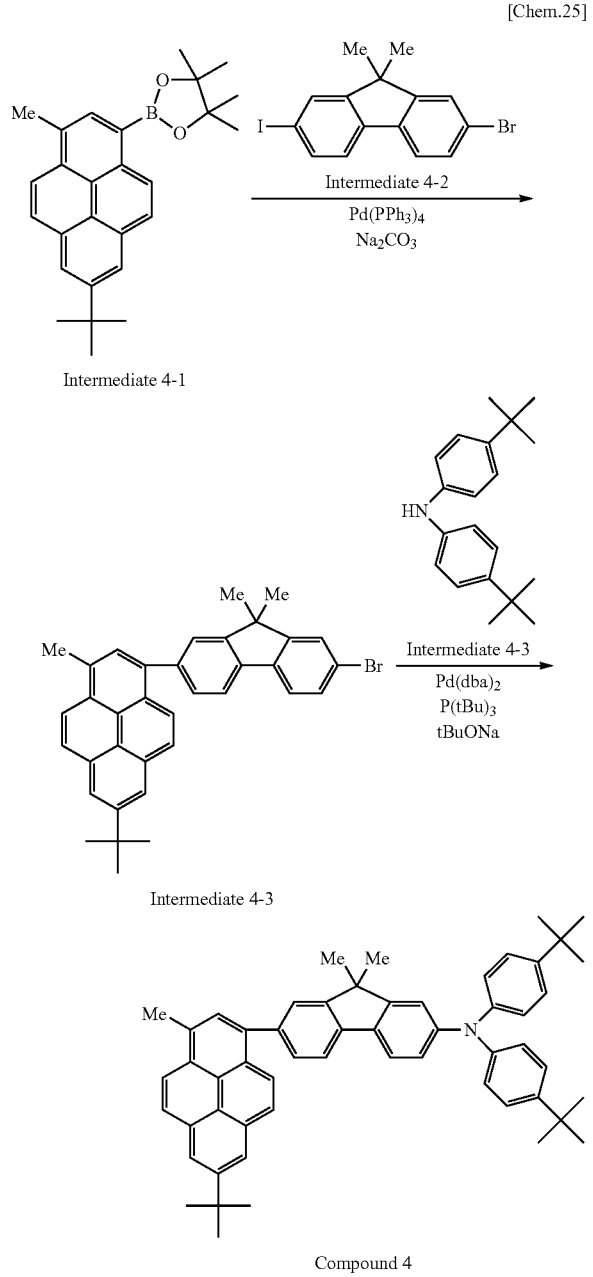

(1) Synthesis of Intermediate 4-3

Intermediate 4-1 (1.0 g (2.51 mmol)), intermediate 4-2 (1.0 g (2.51 mmol)), sodium carbonate (5.0 g), toluene (50 mL), ethanol (10 mL), and water 50 mL were charged into a 200-mL three-necked flask.
Tetrakis(triphenylphosphine)palladium(0) (57.8 mg) was added thereto in a nitrogen atmosphere at room temperature under stirring. The mixture was heated to 80° C. and stirred for 5 hours. After the reaction, the organic layer was subjected to extraction with toluene. The resulting mixture was dried over anhydrous sodium sulfate. The mixture was purified by silica gel column chromatography (eluent: heptane-toluene mixed solvent) to give 0.927 g (yield: 68%) of intermediate 4-3 (yellowish-white crystals).

(2) Synthesis of Compound 4

Intermediate 4-3 (0.924 g (1.70 mmol)), intermediate 4-4 (0.957 g (3.40 mmol)), sodium tert-butoxide (0.65 g (6.80 mmol)), and xylene (100 mL) were charged into a 200-mL three-necked flask. Tri-tert-butylphosphine (34.4 mg (0.17 mmol)) and then palladium dibenzylideneacetone 48.9 mg (0.085 mmol) were added to the mixture in a nitrogen atmosphere at room temperature under stirring. The mixture was heated to 125° C. and stirred for 3 hours. After the reaction, the organic layer was subjected to extraction with toluene. The resulting mixture was dried over anhydrous sodium sulfate. The mixture was purified by silica gel column chromatography (eluent: heptane-toluene mixed solvent) to give 0.920 g (yield: 72.7%) of compound 4 (yellowish white crystals).

The M+ of this compound, i.e., 743.5, was confirmed by mass spectrometry. Furthermore, the melting point of the compound was determined by differential scanning calorimetry (DSC) and found to be 323° C.

The PL spectrum of a toluene solution containing compound 4 and having a concentration of $1\times10^{-5}$ mol/L was measured with the spectrofluorometer F-4500 (manufactured by Hitachi Ltd.) at an excitation wavelength of 350 nm. A blue-light-emission spectrum having the maximum peak intensity at 451 nm was observed (see L4 in FIG. 6).

Synthesis Example of Compound 5

[Chem. 26]

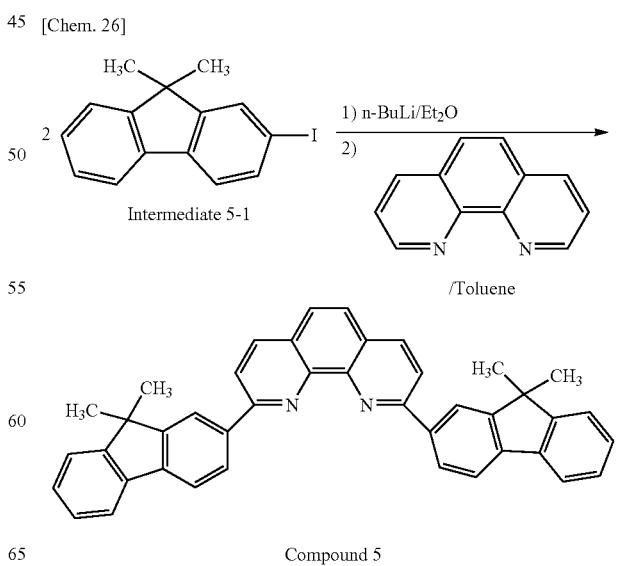

Into a 300-mL three-necked flask, 2-iodo-9,9-dimethylfluorene [intermediate 5-1] (5.8 g (18.1 mmol)) and diethyl ether (80 mL) were charged. In a nitrogen atmosphere, n-butyllithium (15% hexane solution) (11.7 mL (18.1 mmol)) was added dropwise thereto at −78° C. under stirring. The mixture was warmed to room temperature, stirred for 1 hour, and cooled to −20° C. A dispersion of phenanthroline [8B] (0.81 g (4.51 mmol)) in toluene (100 mL) was added dropwise thereto. After the mixture was stirred at room temperature for 12 hours, water was added thereto. The organic layer was subjected to extraction with chloroform. The resulting mixture was dried over anhydrous sodium sulfate and purified by alumina column chromatography (eluent: hexane-chloroform mixed solvent) to give 2.04 g (yield: 80%) of compound 5 (white crystals).

Synthesis Example of Compound 6

(1) Synthesis of Intermediate 6-1

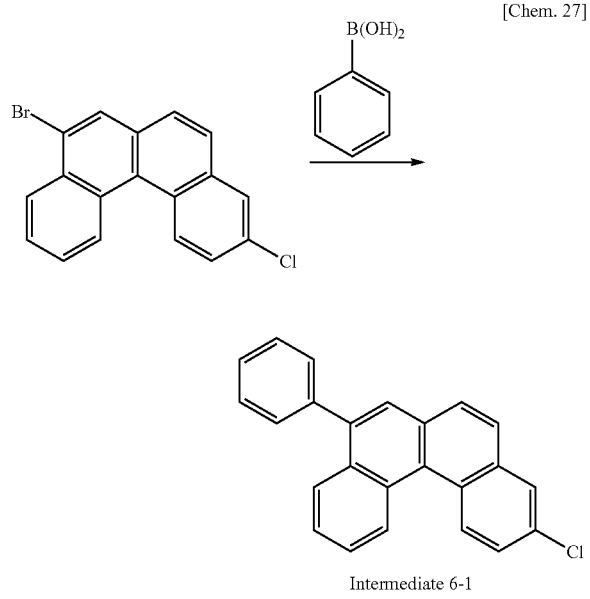

[Chem. 27]

Intermediate 6-1

First, 8-bromo-3-chlorobenzene[c]phenanthrene (260 mg (0.76 mmol)), Phenylboronic acid (97 mg (0.80 mmol)), and tetrakis(triphenylphosphine)palladium(0) (53 mg (0.046 mmol)) were added to a mixture of toluene (4 mL), ethanol (1 mL), and 2 mL of an aqueous solution containing 20 wt % sodium carbonate. The resulting mixture was stirred at 90° C. for 4 hours. After cooling, water (100 mL) was added thereto. The mixture was subjected to extraction with toluene. The organic layer was washed with water (100 mL×2). The resulting organic layer was dried over magnesium sulfate and filtered. The filtrate was condensed, purified by column chromatography (chloroform:heptane=1:9), and washed with methanol to give 180 mg (yield: 69%) of intermediate 6-1 as a white solid.

(2) Synthesis of Intermediate 6-2

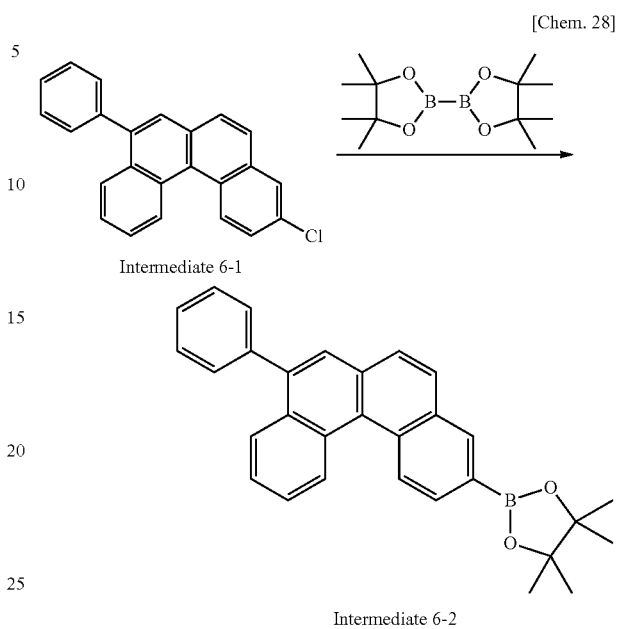

[Chem. 28]

Intermediate 6-1

Intermediate 6-2

Tris(dibenzylideneacetone)dipalladium(0) (48 mg (0.053 mmol)) and tricyclohexylphosphine (37 mg (0.13 mmol)) were added to 1,4-dioxane (5 mL). The mixture was stirred at room temperature for 15 minutes. Intermediate 6-1 (180 mg (0.53 mmol)), bis(pinacolato)diboron (0.20 g (0.79 mmol)), and potassium acetate (77 mg (0.79 mmol)) were added thereto. The mixture was stirred at 95° C. for 3 hours. After cooling, water (100 mL) was added thereto. The mixture was subjected to extraction with toluene. The organic layer was washed with water (100 mL×2). The organic layer was dried over magnesium sulfate and filtered. The filtrate was condensed, purified by column chromatography (chloroform:heptane=1:1), and washed with methanol to give 68 mg (yield: 30%) of intermediate 6-2 as a white solid.

(3) Synthesis of Intermediate 6-3

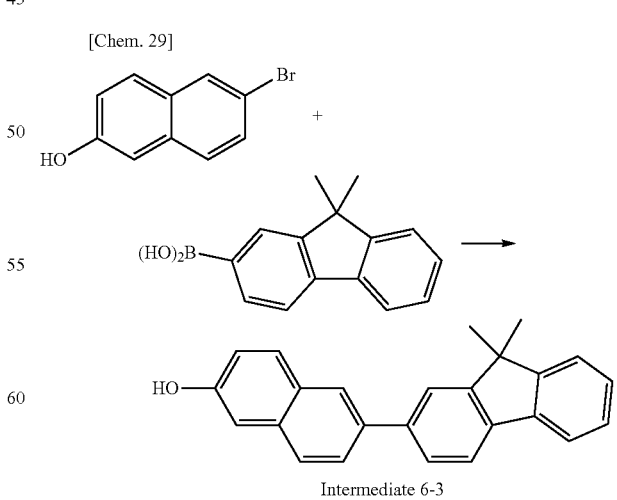

[Chem. 29]

Intermediate 6-3

Intermediate 6-bromonaphthalen-2-ol (3.0 g (13 mmol)), (9,9-dimethyl-9H-fluoren-2-yl)boronic acid (3.3 g (14 mmol)), and tetrakis(triphenylphosphine)palladium(0) (0.31 g (0.27 mmol)) were added to a mixture of toluene (100 mL), ethanol (50 mL), and 50 mL of an aqueous solution containing 20 wt % sodium carbonate. The resulting mixture was stirred at 76° C. for 24 hours. After cooling, extraction was performed with chloroform. The organic layer was dried over magnesium sulfate. The resulting solution was roughly purified by column chromatography (chloroform). The resulting crude product was washed with heptane to give 2.7 g (yield: 60%) of intermediate 6-3 as a pale brown solid.

(4) Synthesis of Intermediate 6-4

[Chem. 30]

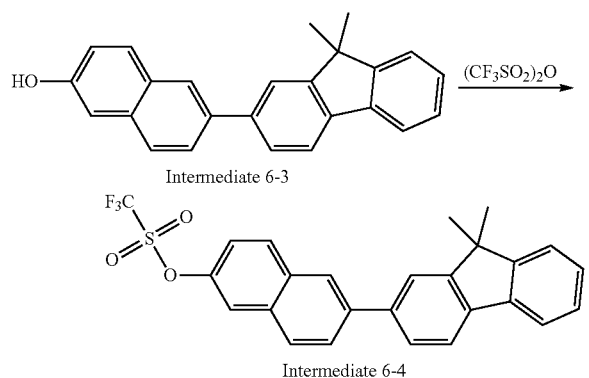

Intermediate 6-3 (0.30 g (0.89 mmol)) was dissolved in pyridine (3 mL), and the solution was cooled to 0° C. Trifluoromethanesulfonic anhydride (0.36 mL (2.1 mmol)) was slowly added dropwise thereto. The reaction solution was stirred for 2 hours while the temperature of the reaction solution was gradually increased to room temperature. Water and toluene were added thereto. The reaction solution was subjected to extraction. The organic layer was dried over sodium sulfate. The solvent was condensed and purified by silica gel column chromatography (toluene:heptane=1:2) to give 0.23 g (yield: 56%) of intermediate 6-4.

(5) Synthesis of Compound 6

[Chem. 31]

Intermediate 6-2 (68 mg (0.16 mmol)), intermediate 6-4 (70 mg (0.15 mmol)), and tetrakis(triphenylphosphine)palladium(0) (17 mg (0.015 mmol)) were added to a mixture of toluene (2 mL), ethanol (1 mL), and 1 mL of an aqueous solution containing 20 wt % sodium carbonate. The resulting mixture was stirred at 90° C. for 2 hours. After cooling, the mixture was subjected to extraction with toluene. The organic layer was washed with water (100 mL×2). The resulting organic layer was dried over magnesium sulfate and filtered. The filtrate was condensed, purified by column chromatography (chloroform:heptane=1:4), and washed with methanol to give 68 mg (yield: 69%) of compound 6 as a white solid.

The structure of this compound was identified by NMR.

$^1$H NMR (CDCl$_3$, 500 MHz) δ (ppm): 9.26 (t, 2H, J=9.5 Hz), 8.41 (S1 H), 8.33 (S1 H), 8.19 (S1 H), 8.14 (d, 1H, J=8.5 Hz), 8.04-8.11 (m, 5H), 7.90 (d, 2H, J=8.5 Hz), 7.86 (d, 1H, J=8.0 Hz), 7.83 (s, 2H), 7.72-7.80 (m, 3H), 7.64 (d, 2H, J=8.0 Hz), 7.55-7.61 (m, 3H), 7.47-7.51 (m, 2H), 7.34-7.40 (m, 2H), 1.60 (s, 6H).

Synthesis Example of Compound 7

Compound 7 was synthesized according to the following scheme.

[Chem. 32]

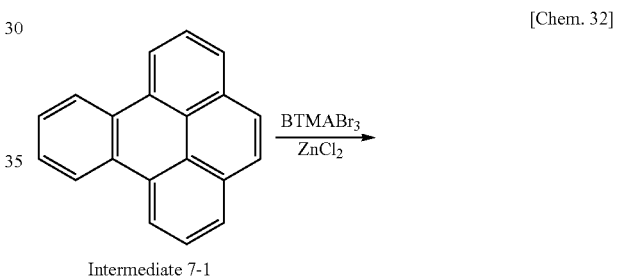

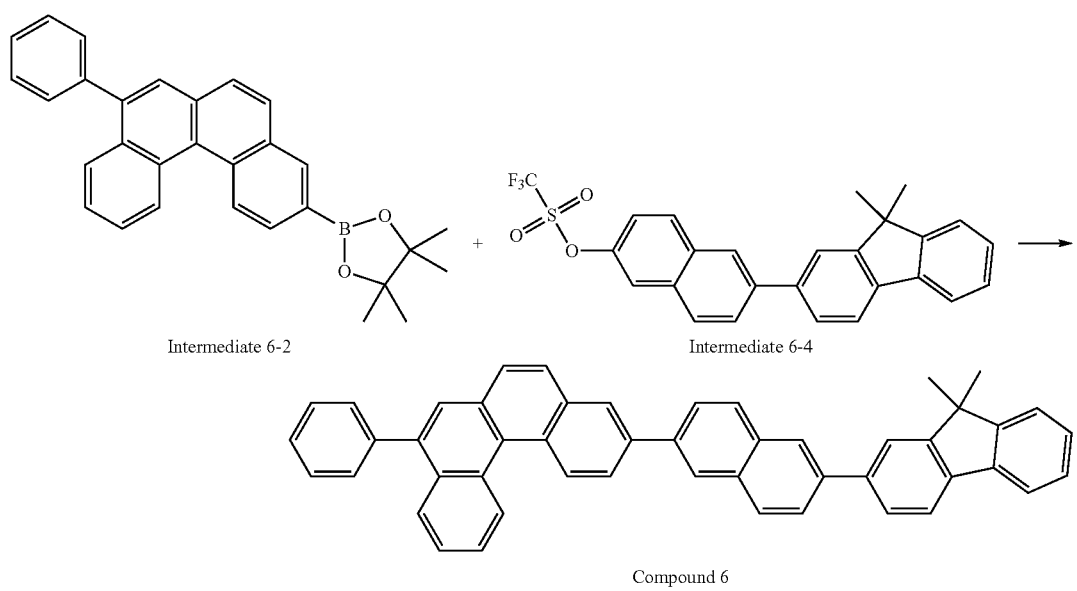

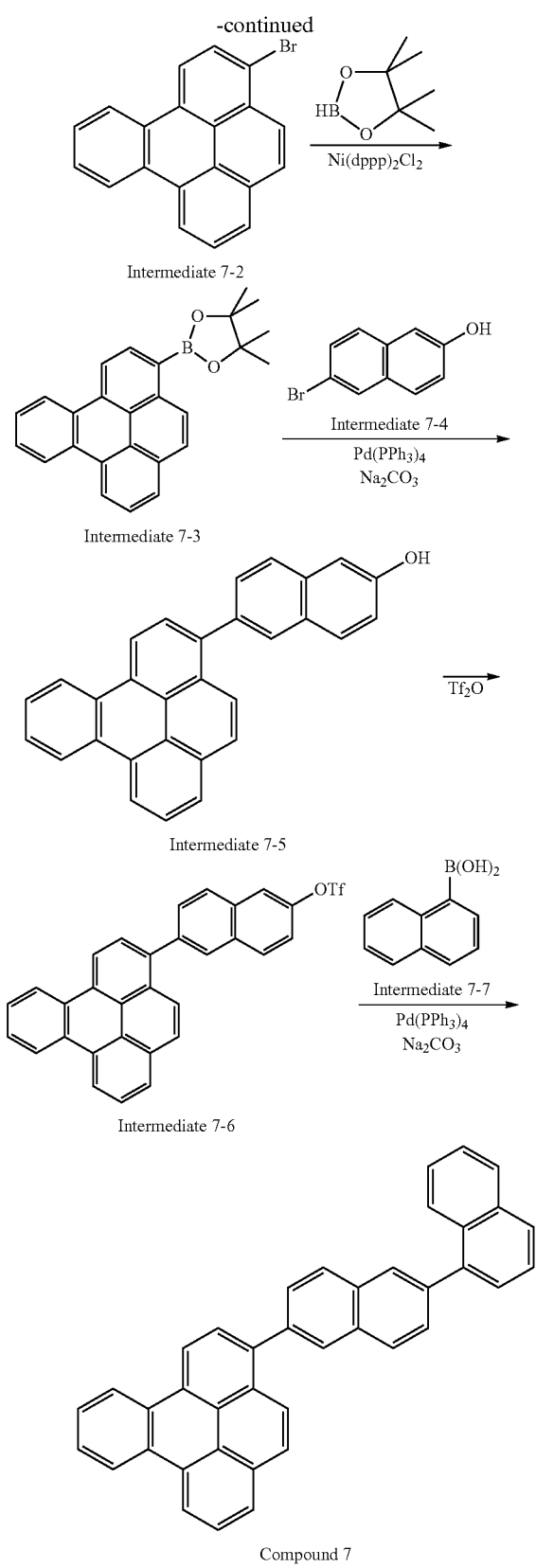

Intermediate 7-2

Intermediate 7-3

Intermediate 7-5

Intermediate 7-6

Compound 7

(1) Synthesis of Compound 7-2

Intermediate 7-1 (0.900 g (3.57 mmol)), benzyltrimethylammonium tribromide (1.389 g (3.56 mmol)), zinc chloride (0.486 g (3.57 mmol)), and chloroform (60 mL) were charged into a 100-mL three-necked flask. The mixture was stirred at room temperature for 3 hours. After the reaction, water (100 mL) was added thereto. The organic layer was subjected to extraction with toluene. The resulting mixture was dried over anhydrous sodium sulfate and purified by silica gel column chromatography (eluent: toluene-heptane mixed solvent) to give 0.963 g (yield: 96%) of intermediate 7-2 (white crystals).

(2) Synthesis of Intermediate 7-3

Intermediate 7-2 (0.900 g (3.43 mmol)), [1,1'-bis(diphenylphosphino)propane]dichloronickel (188 mg (0.343 mmol)), 4,4,5,5,-tetramethyl-1,3,2,-dioxaborolane (0.99 mL (6.85 mmol)), toluene (30 mL), and triethylamine (5 mL) were charged into a 100-mL three-necked flask. The mixture was heated to 90° C. in a nitrogen atmosphere and stirred for 6 hours. After the reaction, water (50 mL) was added thereto. After the reaction, the organic layer was subjected to extraction with toluene. The resulting mixture was dried over anhydrous sodium sulfate and purified by silica gel column chromatography (eluent: toluene-heptane mixed solvent) to give 1.10 g of (yield: 84.7%) of intermediate 7-3 (white crystals).

(3) Synthesis of Intermediate 7-5

Into a 100-mL three-necked flask, a-4 (0.624 g (2.80 mmol)), intermediate 7-5 (1.10 g (2.91 mmol)), toluene (20 mL), and ethanol (10 mL) were charged. An aqueous solution of sodium carbonate (10 g)/water (20 mL) was added dropwise thereto in a nitrogen atmosphere at room temperature under stirring. Then tetrakis(triphenylphosphine)palladium (0) (0.161 mg) was added thereto. The mixture was heated to 77° C. and stirred for 5 hours. After the reaction, the organic layer was subjected to extraction with toluene. The resulting mixture was dried over anhydrous sodium sulfate and purified by silica gel column chromatography (eluent: toluene-heptane mixed solvent) to give 0.94 g (yield: 85%) of intermediate 7-5 (white crystals).

(4) Synthesis of Intermediate 7-6

Intermediate 7-5 (0.94 g (2.38 mmol)) and anhydrous pyridine (50 mL) were charged into a 200-mL three-necked flask. Trifluoromethanesulfonic anhydride (Tf$_2$O) (0.56 mL (4.47 mmol)) were slowly added dropwise in a nitrogen atmosphere under stirring on ice. The mixture was stirred for 1 hour. The reaction solution was stirred at room temperature for 2 hours. After the reaction, water (50 mL) was added to the reaction solution. The organic layer was subjected to extraction with toluene. The resulting mixture was dried over anhydrous sodium sulfate and purified by silica gel column chromatography (eluent: toluene-heptane mixed solvent) to give 1.09 g (yield: 87%) of intermediate 7-6 (white crystals).

(5) Synthesis of Compound 7

Intermediate 7-6 (0.50 g (0.95 mmol)), intermediate 7-7 (0.180 g (1.04 mmol)), sodium carbonate (1.06 g (10.0 mmol)), toluene (30 mL), ethanol (10 mL), and water (20 mL) were charged into a 100-mL three-necked flask. Tetrakis(triphenylphosphine)palladium(0) (57.8 mg) was added thereto in a nitrogen atmosphere at room temperature under stirring. The mixture was heated to 80° C. and stirred for 5 hours. After the reaction, the organic layer was subjected to extraction with toluene. The resulting mixture was dried over anhydrous sodium sulfate and purified by silica gel column chromatography (eluent: toluene-heptane mixed solvent) to give 0.360 g (yield: 75%) of compound 7 (yellowish white crystals).

The M$^+$ of compound 7, i.e., 504, was confirmed by mass spectrometry.

The structure of compound 7 was identified by $^1$H NMR.

¹H NMR (CDCl₃, 400 MHz) δ (ppm): 9.01 (d, 1H), 8.95 (d, 1H), 8.93-8.87 (m, 1H), 8.24-7.92 (m, 12H), 7.84 (d, 1H), 7.79-7.77 (m, 2H), 7.74 (d, 2H), 7.62-7.59 (m, 2H), 7.55-7.48 (m, 4H).

Synthesis Example of Compound 8

Compound 8 was synthesized according to the following scheme.

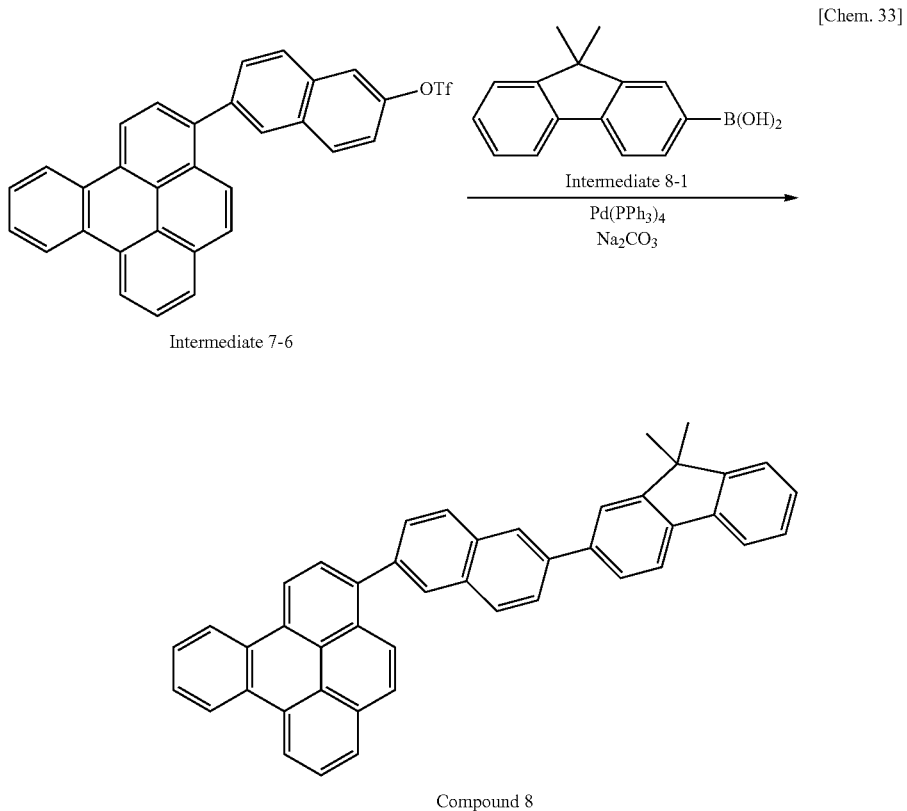

Intermediate 7-6 (0.50 g (0.95 mmol)), intermediate 8-1 (0.248 g (1.04 mmol)), sodium carbonate (1.06 g (10.0 mmol)), toluene (30 mL), ethanol (10 mL), and water (20 mL) were charged into a 100-mL three-necked flask. Tetrakis(triphenylphosphine)palladium(0) (57.8 mg) was added thereto in a nitrogen atmosphere at room temperature under stirring. The mixture was heated to 80° C. and stirred for 5 hours. After the reaction, the organic layer was subjected to extraction with toluene. The resulting mixture was dried over anhydrous sodium sulfate and purified by silica gel column chromatography (eluent: toluene-heptane mixed solvent to give 0.423 g (yield: 78%) of compound 8 (whitish yellow crystals).

The M⁺ of compound 8, i.e., 570, was confirmed by mass spectrometry.

The structure of compound 8 was identified by ¹H NMR.

¹H NMR (CDCl₃, 600 MHz) δ (ppm): 9.01 (d, 1H), 8.96 (d, 1H), 8.88-8.94 (m, 2H), 8.25 (S1 H), 8.23 (d, 1H), 8.19 (d, 1H), 8.15 (s, 2H), 8.12 (d, 1H), 8.07 (T1H), 8.06 (d, 1H), 8.02 (d, 1H), 7.93 (dd, 1H), 7.87 (T1H), 7.85 (S1 H), 7.83 (dd, 1H), 7.78-7.81 (m, 4H), 7.50 (d, 1H), 7.35-7.40 (m, 2H), 1.61 (s, 6H).

Synthesis Example of Compound 9

Exemplary compound 1-1 was produced by a method described below. Note that 2,7-(Bpin)₂pyrene was synthesized according to a method described in Chemical Communication, 2005, pp. 2172-2174.

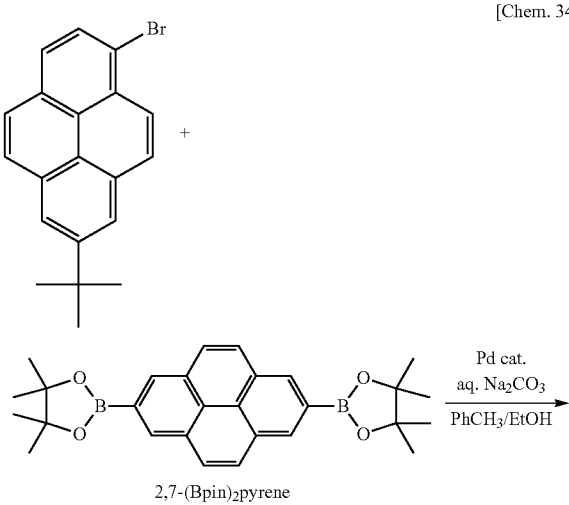

-continued

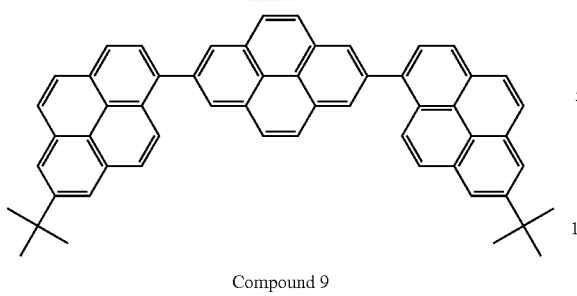

Compound 9

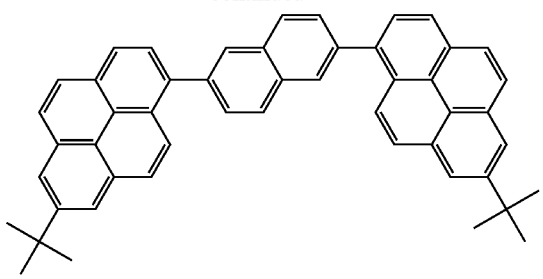

Compound 10

The following compounds were dissolved in a mixed solvent of toluene (50 mL) and ethanol (10 mL) in a nitrogen atmosphere. An aqueous solution of sodium carbonate (1.45 g (13.7 mmol)) dissolved in distilled water (7 mL) was added thereto. The resulting mixture was stirred for 5 hours in a silicone oil bath heated to 90° C.

7-tert-Butyl-1-bromopyrene 2.03 g (6.02 mmol)

2,7-(Bpin)$_2$pyrene 1.24 g (2.74 mmol)

Bis(triphenylphosphine)palladium(II) dichloride (Pd(PPh$_3$)$_2$Cl$_2$) 0.192 g (0.274 mmol)

After cooling to room temperature, the precipitated solid was filtered and washed with water and methanol. The resulting solid was dried in vacuo and heated to dissolve in chlorobenzene. Hot filtration was performed to remove insoluble matter. Recrystallization was performed from the resulting filtrate to give 1.13 g (yield: 58%) of compound 9 as white crystals.

The M$^+$ of this compound, i.e., 714.3, was confirmed by MALDI-TOF MS.

Synthesis Example of Compound 10

The following compounds were dissolved in a mixed solvent of toluene (80 mL) and ethanol (40 mL) in a nitrogen atmosphere. Then a 10 wt % sodium carbonate aqueous solution (40 mL) was added thereto. To remove oxygen in the system, argon was bubbled into the mixture. The mixture was then refluxed for 20 hours.

2-(7-tert-Butylpyren-1-yl)-4,4,5,5-tetramethyl-[1,3,2]dioxaborane 1.70 g (4.40 mmol)

2,7-Dibromophenanthrene 724 mg (2.16 mmol)

Tetrakis(triphenylphosphine)palladium 80.8 mg (0.070 mmol)

After the mixture was allowed to reach room temperature, the mixture was subjected to extraction with chloroform. The organic layer was dried over magnesium sulfate. To remove residual palladium, silica to remove heavy metals (SH type, manufactured by Fuji Silysia Chemical Ltd.) was added thereto. The mixture was stirred for a while. The silica and magnesium sulfate were then filtered off. The organic layer was condensed to yield 1.65 g of a crude product. The crude product was recrystallized from chlorobenzene to give 0.94 g (yield: 63%) of compound 10 as a white powder.

The M$^+$ of this compound, i.e., 690.2, was confirmed by MALDI-TOF MS.

Synthesis Example of Compound 11

[Chem. 35]

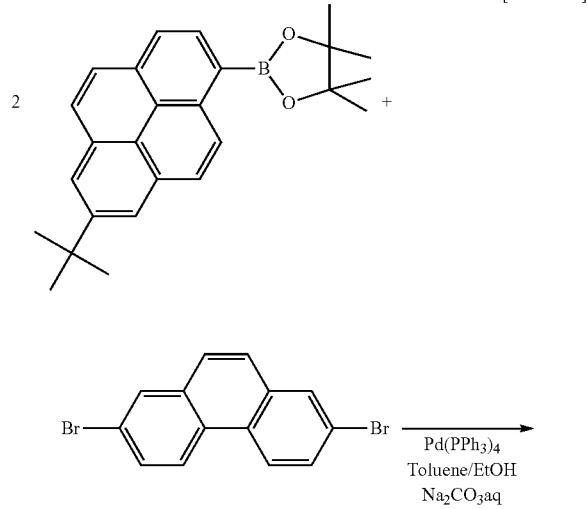

[Chem. 36]

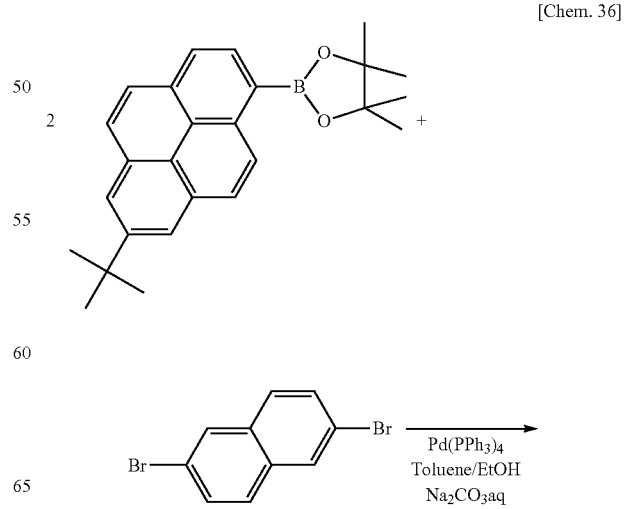

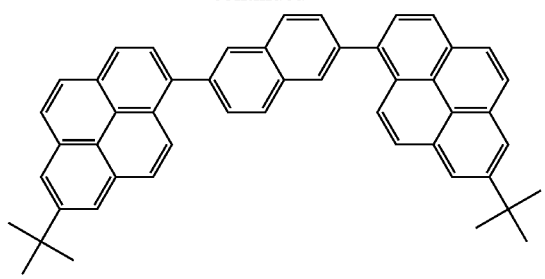

Compound 11

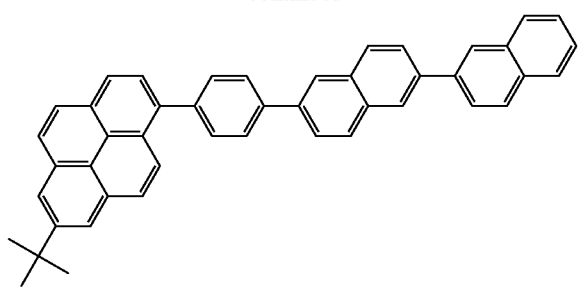

Compound 12

The following compounds were dissolved in a mixed solvent of toluene (80 mL) and ethanol (40 mL) in a nitrogen atmosphere. Then a 10 wt % sodium carbonate aqueous solution (40 mL) was added thereto. To remove oxygen in the system, argon was bubbled into the mixture. The mixture was then refluxed for 20 hours.

2-(7-tert-Butylpyren-1-yl)-4,4,5,5-tetramethyl-[1,3,2]dioxaborane 1.41 g (3.67 mmol)

2,6-Dibromophenanthrene 508 mg (1.78 mmol)

Tetrakis(triphenylphosphine)palladium 85 mg (0.081 mmol)

After the mixture was allowed to reach room temperature, the mixture was subjected to extraction with chloroform. The organic layer was dried over magnesium sulfate. To remove residual palladium, silica to remove heavy metals (SH type, manufactured by Fuji Silysia Chemical Ltd.) was added thereto. The mixture was stirred for a while. The silica and magnesium sulfate were then filtered off. The organic layer was condensed to yield 0.90 g of a crude product. The crude product was recrystallized from chlorobenzene to give 0.88 g (yield: 63%) of compound 11 as a white powder.

The M+ of this compound, i.e., 639.9, was confirmed by MALDI-TOF MS.

Synthesis Example of Compound 12

The following compounds were dissolved in a mixed solvent of toluene (80 mL) and ethanol (40 mL) in a nitrogen atmosphere. Then a 10 wt % sodium carbonate aqueous solution (40 mL) was added thereto. To remove oxygen in the system, argon was bubbled into the mixture. The mixture was then refluxed for 16.5 hours.

Intermediate 12-1 1.00 g (2.15 mmol)

Intermediate 12-2 0.89 g (2.11 mmol)

Tetrakis(triphenylphosphine)palladium 296.9 mg (0.257 mmol)

After the mixture was allowed to reach room temperature, the mixture was subjected to extraction with chloroform. The organic layer was dried over magnesium sulfate. To remove residual palladium, silica to remove heavy metals (SH type, manufactured by Fuji Silysia Chemical Ltd.) was added thereto. The mixture was stirred for a while. The silica and magnesium sulfate were then filtered off. The organic layer was condensed to yield 1.46 g of a crude product. The crude product was dispersed in acetone to remove highly polar impurities. The crude product was recrystallized from toluene and dispersed in methanol to give 0.83 g (yield: 66%) of compound 12 as a white powder.

The M+ of this compound, i.e., 586.3, was confirmed by MALDI-TOF MS.

Synthesis Example of Compound 13

[Chem. 37]

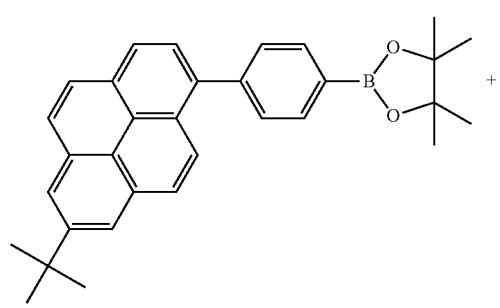

Interemediate 12-1

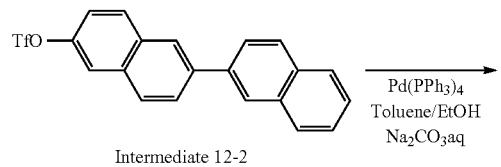

Intermediate 12-2

[Chem. 38]

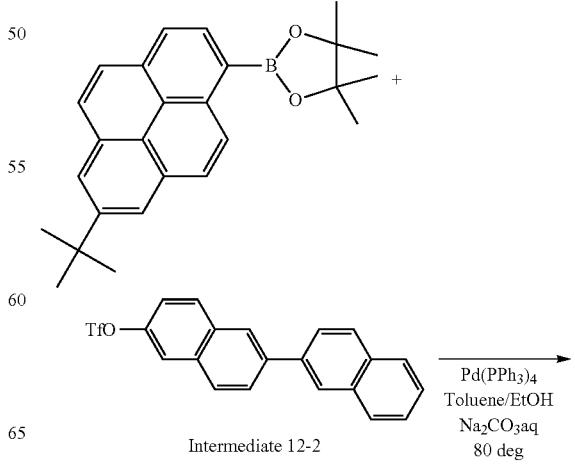

-continued

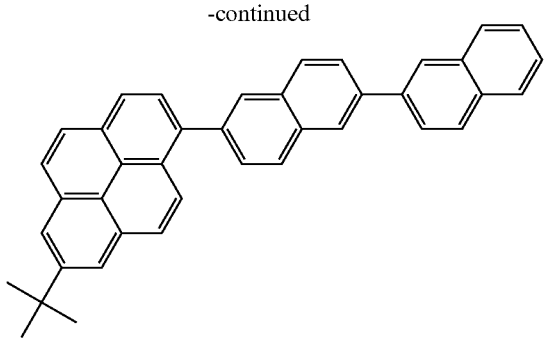

Compound 13

The following compounds were dissolved in a mixed solvent of toluene (80 mL) and ethanol (40 mL) in a nitrogen atmosphere. Then a 10 wt % sodium carbonate aqueous solution (40 mL) was added thereto. To remove oxygen in the system, argon was bubbled into the mixture. The mixture was then refluxed for 15 hours.

2-(7-tert-Butylpyren-1-yl)-4,4,5,5-tetramethyl-[1,3,2]dioxaborane 3.2 g (8.33 mmol)

Intermediate 12-2 3.2 g (7.95 mmol)

Tetrakis(triphenylphosphine)palladium 189 mg (0.154 mmol)

After the mixture was allowed to reach room temperature, the mixture was subjected to extraction with chloroform. The organic layer was dried over magnesium sulfate. To remove residual palladium, silica to remove heavy metals (SH type, manufactured by Fuji Silysia Chemical Ltd.) was added thereto. The mixture was stirred for a while. The silica and magnesium sulfate were then filtered off. The organic layer was condensed. The resulting condensed product was dispersed in acetone and then methanol to remove highly polar impurities. The resulting crude product was recrystallized from toluene and dispersed in cyclohexane to give 2.49 g (yield: 66%) of compound 13 as a white powder.

The $M^+$ of this compound, i.e., 510.2, was confirmed by MALDI-TOF MS.

Chemical formulae of compounds used in comparative examples are described below.

[Chem. 39]

Compound 14

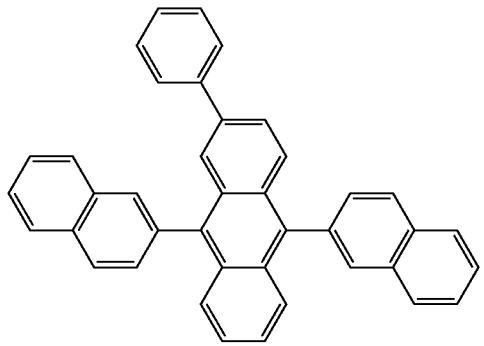

Compound 15

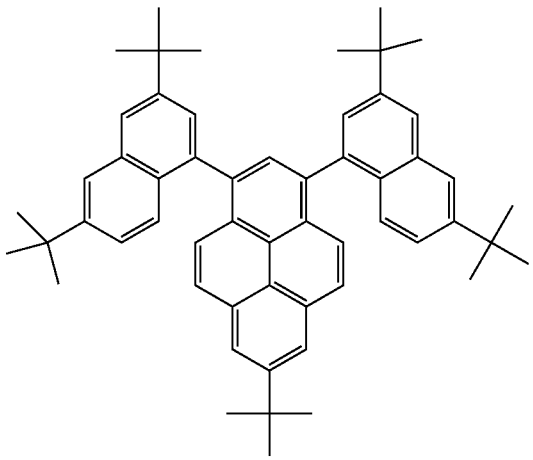

Compound 16

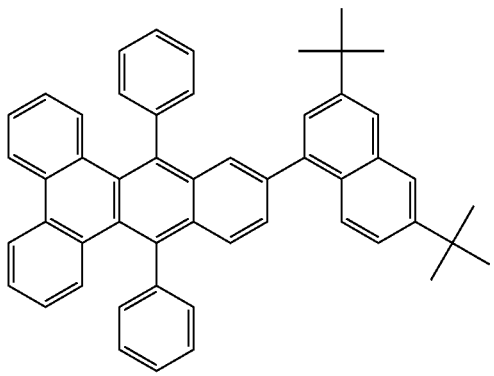

Compound 17

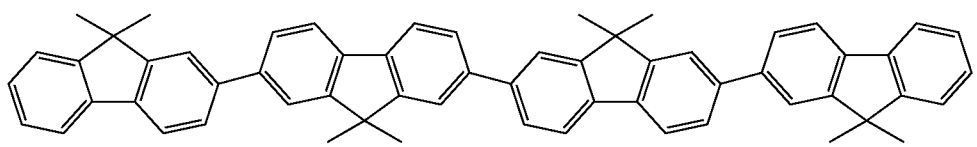

Among the compounds used in examples and comparative examples, the energies of the HOMOs and LUMOs of compound 3, compound 4, and compounds 6 to 17 are shown in Table 1. A thin film of each of the compounds was formed on a slide glass by vacuum evaporation. The energy of the HOMO of each thin film was measured with a photoelectron spectrometer in air (trade name: AC-1). The visible light absorption spectrum of each thin film was measured with a spectrophotometer (trade name: U-3010). The energy gap was determined from the measurement result, thus calculating the energy of the LUMO.

TABLE 1

| Compound | HOMO energy [eV] | LUMO energy [eV] |
|---|---|---|
| Compound 3 | −5.87 | −3.17 |
| Compound 4 | −5.40 | −2.53 |
| Compound 6 | −5.72 | −2.69 |
| Compound 7 | −5.89 | −2.79 |
| Compound 8 | −5.67 | −2.59 |
| Compound 9 | −5.78 | −2.79 |
| Compound 10 | −5.75 | −2.75 |
| Compound 11 | −5.75 | −2.76 |
| Compound 12 | −5.69 | −2.67 |
| Compound 13 | −5.66 | −2.66 |
| Compound 14 | −5.71 | −2.81 |
| Compound 15 | −5.87 | −3.09 |
| Compound 16 | −5.87 | −2.88 |
| Compound 17 | −5.77 | −2.85 |

Among the compounds used in examples and comparative examples, with respect to compounds 6 to 17, the energy of the lowest excited triplet state and the minimum exposed surface area of a single bond between aromatic hydrocarbon moieties are shown in Table 2. A thin film of each of compounds 6 and 13 was formed by vacuum evaporation on a slide glass. The energy of the lowest excited triplet state was measured. In the case of compounds 7 to 12 and compounds 15 to 17, each compound and compound 18, which serves as a triplet sensitizer, were co-deposited to form a thin film on a slide glass, and the energy of the lowest excited triplet state was measured. The concentration of the triplet sensitizer was 10% by weight. The triplet sensitizer had a thickness of 100 nm. The energy of the lowest excited triplet state of each compound was measured with the spectrofluorometer (trade name: F-4500).

[Chem. 40]

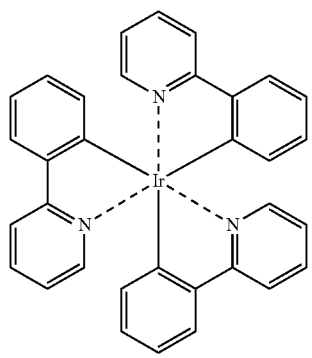

Compound 18

The energy value of the lowest excited triplet state of compound 14 is the estimate of the measured value of the energy of the lowest excited triplet state of the thin film of compound 14. The estimate is determined as follows: The calculated value of the (absorption) energy of the lowest excited triplet state is determined by the following calculation method. Then the estimate is calculated using expression 2.

1) Optimization of Structure
   Density functional theory (DFT)
   Function: B3LYP
   Basis function: deft-SV(P)
   Software: TURBOMOLE
2) (Absorption) Energy of Lowest Excited Triplet State
   Time-dependent density-functional theory (TDDFT)
   Density functional theory (DFT) (DFT)
   Function: B3LYP
   Basis function: def2-SV(P)
   Software: TURBOMOLE
Software: TURBOMOLE:
TURBOMOLE:
R. Ahlrichs, M. Baer, M. Haeser, H. Horn, and C. Koelmel Electronic structure calculations on workstation computers: the program system TURBOMOLE Chem. Phys. Let T162:165 (1989)

For each of compounds 3 to 17, the minimum exposed surface area of a single bond between aromatic hydrocarbon moieties was calculated by the following calculation method.
1) Initial structure (determination of most stable structure of conformers)
   Molecular mechanics (MM3)
   Software: Cache
2) Optimization of structure in lowest excited triplet state
   Density functional theory (DFT)
   Function: B3LYP
   Basis function: def2-SV(P)
   Software: TURBOMOLE
3) Exposed surface area and its minimum value of single bond between aromatic hydrocarbon moieties
   Proximity=3.0 Å
   Probe radius=1.7 Å
   Approximation method: geodesic dome approximation method

TABLE 2

| Compound | Energy of lowest excited triplet state T1 [eV] | Minimum exposed surface area of single bond between aromatic hydrocarbon moieties |
|---|---|---|
| Compound 6 | 2.11 | 87.3 |
| Compound 7 | 2.00 | 99.6 |
| Compound 8 | 1.99 | 97.7 |
| Compound 9 | 1.84 | 95.7 |
| Compound 10 | 1.83 | 96.7 |
| Compound 11 | 1.83 | 96.5 |
| Compound 12 | 1.86 | 104.4 |
| Compound 13 | 1.85 | 96.8 |
| Compound 14 | 2.08 | 76.8 |
| Compound 15 | 1.92 | 44.1 |
| Compound 16 | 1.87 | 57.2 |
| Compound 17 | 2.12 | 76.0 |

Example 1

Indium tin oxide (ITO) was deposited by sputtering on a glass substrate so as to form a film, which served as an anode, having a thickness of 130 nm. The resulting substrate was used as a transparent conductive supporting substrate. The substrate was subjected to ultrasonic cleaning in acetone and then isopropyl alcohol (IPA), boiling cleaning with IPA, drying, and UV/ozone cleaning.

Compound 1 was used as a material for a hole injection layer. A chloroform solution containing 0.1% by weight compound 1 was prepared.

This solution was dropped on the ITO electrode. Spin coating was performed at 500 RPM for 10 seconds and then at 1000 RPM for 1 minutes to form a thin film. The thin film was dried for 10 minutes at 80° C. in a vacuum oven to completely remove the solvent in the thin film. The resulting hole injection layer had a thickness of 11 nm.

Next, compound 2 was deposited by vacuum evaporation to form a hole transport layer having a thickness of 15 nm.

A light-emitting layer was formed by co-evaporation of compound 6 serving as a host material and compound 3 serving as a blue-fluorescent material having the ability to trap electrons, the compounds 6 and 3 being fed from different boats. The concentration of the light-emitting material was 5% by weight. The light-emitting layer had a thickness of 30 nm.

Compound 7 was deposited by vacuum evaporation to form a hole-blocking layer having a thickness of 10 nm.

Compound 5 was deposited by vacuum evaporation to form an electron transport layer having a thickness of 30 nm.

During the evaporation of the organic layers, the degree of vacuum was $7.0 \times 10^{-5}$ Pa or less, and the deposition rate was in the range of 0.08 nm/sec to 0.10 nm/sec. Note that in the case of the light-emitting layer, the deposition rate indicates the total deposition rate of both the host material and the dopant material.

Next, lithium fluoride (LiF) was deposited by vacuum evaporation on the resulting organic layer to form a film having a thickness of 0.5 nm. An aluminum film having a thickness of 150 nm was formed thereon by vacuum evaporation, providing an electron injection electrode (cathode). Thereby, an organic light-emitting device was produced. During the evaporation, the degree of vacuum was $1.0 \times 10^{-4}$ Pa. The deposition rate of lithium fluoride was 0.05 nm/sec. The deposition rate of aluminum was in the range of 1.0 nm/sec to 1.2 nm/sec.

The resulting sample organic light-emitting device was covered with a protective glass plate in a nitrogen atmosphere with a dew point of −70° C. or lower so as not to adsorb water, and was sealed with an epoxy-based adhesive. Note that a recess was formed on the adhesive surface side of the protective glass, and a moisture-absorbent sheet (a moisture getter sheet for organic EL, manufactured by Dynic Corporation) was arranged therein.

For the resulting device, the ITO electrode (anode) was used as a positive electrode. The aluminum electrode (cathode) was used as a negative electrode. When a voltage of 5.6 V was applied between the electrodes, blue-light emission originating from the blue-fluorescent dopant material was observed at a luminance of 3508 cd/m² and a luminous efficiency of 7.89 cd/A. The CIE chromaticity coordinates was (x, y)=(0.17, 0.29).

In the case where a voltage was applied to the device while a constant current density of 100 mA/cm² was maintained, the length of time that the luminance was reduced to 50% of the initial luminance was 143 hours, which indicated a satisfactory lifetime.

From Table 1, the energies of the HOMOs and LUMOs of compounds 3 and 6 satisfy the following expressions:

|LUMO(compound 3)|−|LUMO(compound 6)|>0.15 eV, and

|HOMO(compound 6)|<|HOMO(compound 3)|.

The blue-fluorescent material, i.e., compound 3, in the light-emitting layer traps only electrons.

From Table 1, the energies of the HOMOs of compounds 6 and 7 satisfy the following expression:

|HOMO(compound 6)|<|HOMO(compound 7)|.

A layer which is adjacent to the light-emitting layer that traps only electrons and which is located near the cathode blocks holes.

From Table 2, the energies of the lowest excited triplet states T1 of compounds 6 and 7 satisfy the following expression:

T1(compound 6)<T1(compound 7)>0.1 eV.

Furthermore, each of compounds 6 and 7 is a hydrocarbon compound having a plurality of mono- or higher-valent aromatic hydrocarbon moieties each optionally substituted with an alkyl group, and the aromatic hydrocarbon moieties being linked together only by a single bond. Moreover, a substructure containing the single bond and the aromatic hydrocarbon moieties linked together by the single bond is represented only by general formula [1] or [2].

From Table 2, in each of compounds 6 and 7, the minimum exposed surface area of the single bond between the aromatic hydrocarbon moieties is higher than 87.

Example 2

A device was produced as in Example 1, except that compound 9 serving as the hole-blocking layer was used in place of compound 7.

When a voltage of 5.6 V was applied to the device in this example, blue-light emission originating from the blue-fluorescent dopant material was observed at a luminance of 2151 cd/m² and a luminous efficiency of 6.69 cd/A. The CIE chromaticity coordinates was (x, y)=(0.20, 0.33).

In the case where a voltage was applied to the device in this example while a constant current density of 100 mA/cm² was maintained, the length of time that the luminance was reduced to 50% of the initial luminance was 237 hours, which indicated a satisfactory lifetime.

From Table 1, the energies of the HOMOs of compounds 6 and 9 satisfy the following expression:

|HOMO(compound 6)|<|HOMO(compound 9)|.

A layer which is adjacent to the light-emitting layer that traps only electrons and which is located near the cathode blocks holes.

From Table 2, the energies of the lowest excited triplet states T1 of compounds 6 and 9 satisfy the following expression:

T1(compound 6)−T1(compound 9)>0.1 eV.

Furthermore, each of compounds 6 and 9 is a hydrocarbon compound having a plurality of mono- or higher-valent aromatic hydrocarbon moieties each optionally substituted with an alkyl group, and the aromatic hydrocarbon moieties being linked together only by a single bond. Moreover, a substructure containing the single bond and the aromatic hydrocarbon moieties linked together by the single bond is represented only by general formula [1] or [2].

From Table 2, in each of compounds 6 and 9, the minimum exposed surface area of the single bond between the aromatic hydrocarbon moieties is higher than 87.

Example 3

A device was produced as in Example 1, except that compound 8 serving as the host material in the light-emitting layer was used in place of compound 6 and that compound 10 serving as the hole-blocking layer was used in place of compound 7.

When a voltage of 5.6 V was applied to the device in this example, blue-light emission originating from the blue-fluorescent dopant material was observed at a luminance of 5176 cd/m² and a luminous efficiency of 7.89 cd/A. The CIE chromaticity coordinates was (x, y)=(0.15, 0.16).

In the case where a voltage was applied to the device in this example while a constant current density of 100 mA/cm² was maintained, the length of time that the luminance was reduced to 50% of the initial luminance was 378 hours, which indicated a satisfactory lifetime.

From Table 1, the energies of the HOMOs and LUMOs of compounds 3 and 8 satisfy the following expressions:

|LUMO(compound 3)|−|LUMO(compound 8)|>0.15 eV, and

|HOMO(compound 8)|<|HOMO(compound 3)|.

The blue-fluorescent material, i.e., compound 3, in the light-emitting layer traps only electrons.

From Table 1, the energies of the HOMOs of compounds 8 and 10 satisfy the following expression:

|HOMO(compound 8)|<|HOMO(compound 10)|.

A layer which is adjacent to the light-emitting layer that traps only electrons and which is located near the cathode blocks holes.

From Table 2, the energies of the lowest excited triplet states T1 of compounds 8 and 10 satisfy the following expression:

T1(compound 8)−T1(compound 10)>0.1 eV.

Furthermore, each of compounds 8 and 10 is a hydrocarbon compound having a plurality of mono- or higher-valent aromatic hydrocarbon moieties each optionally substituted with an alkyl group, and the aromatic hydrocarbon moieties being linked together only by a single bond. Moreover, a substructure containing the single bond and the aromatic hydrocarbon moieties linked together by the single bond is represented only by general formula [1] or [2].

From Table 2, in each of compounds 8 and 10, the minimum exposed surface area of the single bond between the aromatic hydrocarbon moieties is higher than 87.

Example 4

A device was produced as in Example 3, except that compound 11 serving as the hole-blocking layer was used in place of compound 10.

When a voltage of 5.6 V was applied to the device in this example, blue-light emission originating from the blue-fluorescent dopant material was observed at a luminance of 4468 cd/m² and a luminous efficiency of 7.75 cd/A. The CIE chromaticity coordinates was (x, y)=(0.15, 0.26).

In the case where a voltage was applied to the device in this example while a constant current density of 100 mA/cm² was maintained, the length of time that the luminance was reduced to 50% of the initial luminance was 411 hours, which indicated a satisfactory lifetime.

From Table 1, the energies of the HOMOs of compounds 8 and 11 satisfy the following expression:

|HOMO(compound 8)|<|HOMO(compound 11)|.

A layer which is adjacent to the light-emitting layer that traps only electrons and which is located near the cathode blocks holes.

From Table 2, the energies of the lowest excited triplet states T1 of compounds 8 and 11 satisfy the following expression:

T1(compound 8)−T1(compound 11)>0.1 eV.

Furthermore, each of compounds 8 and 11 is a hydrocarbon compound having a plurality of mono- or higher-valent aromatic hydrocarbon moieties each optionally substituted with an alkyl group, and the aromatic hydrocarbon moieties being linked together only by a single bond. Moreover, a substructure containing the single bond and the aromatic hydrocarbon moieties linked together by the single bond is represented only by general formula [1] or [2].

From Table 2, in each of compounds 8 and 11, the minimum exposed surface area of the single bond between the aromatic hydrocarbon moieties is higher than 87.

Comparative Example 1

A device was produced as in Example 1, except that compound 14 serving as the host material in the light-emitting layer was used in place of compound 6.

When a voltage of 5.6 V was applied to the device of this comparative example, blue-light emission originating from the blue-fluorescent dopant material was observed at a luminance of 3293 cd/m² and a luminous efficiency of 6.13 cd/A. The CIE chromaticity coordinates was (x, y)=(0.16, 0.27).

In the case where a voltage was applied to the device in this comparative example while a constant current density of 100 mA/cm² was maintained, the length of time that the luminance was reduced to 50% of the initial luminance was 23 hours, which indicated a lifetime shorter than those in Examples 1 to 4.

From Table 1, the energies of the HOMOs and LUMOs of compounds 3 and 14 satisfy the following expressions:

LUMO(compound 3)|−|LUMO(compound 14)|>0.15 eV, and

|HOMO(compound 14)|<|HOMO(compound 3)|.

The blue-fluorescent material, i.e., compound 3, in the light-emitting layer traps only electrons.

From Table 1, the energies of the HOMOs of compounds 14 and 7 satisfy the following expression:

|HOMO(compound 14)|<|HOMO(compound 7)|.

A layer which is adjacent to the light-emitting layer that traps only electrons and which is located near the cathode blocks holes.

From Table 2, the energies of the lowest excited triplet states T1 of compounds 14 and 7 do not satisfy the following expression:

T1(host)−T1(HBL)>0.1 eV.

Furthermore, compound 14 is a hydrocarbon compound having a plurality of mono- or higher-valent aromatic hydrocarbon moieties each optionally substituted with an alkyl group, and the aromatic hydrocarbon moieties being linked together only by a single bond. However, a substructure containing the single bond and the aromatic hydrocarbon moieties linked together by the single bond is not represented only by general formula [1] or [2]. From Table 2, for compound 14, the minimum exposed surface area of the single bond between the aromatic hydrocarbon moieties is 87 or less.

Comparative Example 2

A device was produced as in Example 1, except that compound 15 serving as the host material in the light-emitting layer was used in place of compound 6.

When a voltage of 5.6 V was applied to the device of this comparative example, blue-light emission originating from the blue-fluorescent dopant material was observed at a luminance of 200 cd/m$^2$ and a luminous efficiency of 6.37 cd/A. The CIE chromaticity coordinates was (x, y)=(0.16, 0.20).

In the case where a voltage was applied to the device in this comparative example while a constant current density of 100 mA/cm$^2$ was maintained, the length of time that the luminance was reduced to 50% of the initial luminance was 39 hours, which indicated a lifetime shorter than those in Examples 1 to 4.

From Table 1, the energies of the HOMOs and LUMOs of compounds 3 and 15 satisfy the following expressions:

|LUMO(compound 3)|−|LUMO(compound 15)|>0.15 eV, and

|HOMO(compound 15)|=|HOMO(compound 3)|.

The light-emitting layer does not have a device structure such that the blue-fluorescent material, i.e., compound 3, in the light-emitting layer effectively traps only electrons.

From Table 1, the energies of the HOMOs of compounds 15 and 7 satisfy the following expression:

|HOMO(compound 15)|<|HOMO(compound 7)|.

A layer which is adjacent to the light-emitting layer that slightly traps electrons and which is located near the cathode blocks holes.

From Table 2, the energies of the lowest excited triplet states T1 of compounds 15 and 7 satisfy the following expression:

T1(compound 15)−T1(compound 7)>0.1 eV.

Compound 15 is a hydrocarbon compound having a plurality of mono- or higher-valent aromatic hydrocarbon moieties each optionally substituted with an alkyl group, and the aromatic hydrocarbon moieties being linked together only by a single bond. However, a substructure containing the single bond and the aromatic hydrocarbon moieties linked together by the single bond is not represented only by general formula [1] or [2]. From Table 2, for compound 15, the minimum exposed surface area of the single bond between the aromatic hydrocarbon moieties is 87 or less.

Comparative Example 3

A device was produced as in Example 1, except that compound 16 serving as the hole-blocking material was used in place of compound 7.

When a voltage of 5.6 V was applied to the device of this comparative example, blue-light emission originating from the blue-fluorescent dopant material was observed at a luminance of 3056 cd/m$^2$ and a luminous efficiency of 8.52 cd/A. The CIE chromaticity coordinates was (x, y)=(0.16, 0.28).

In the case where a voltage was applied to the device in this comparative example while a constant current density of 100 mA/cm$^2$ was maintained, the length of time that the luminance was reduced to 50% of the initial luminance was 69 hours, which indicated a lifetime shorter than those in Examples 1 to 4.

From Table 1, the energies of the HOMOs of compounds 6 and 16 satisfy the following expression:

|HOMO(compound 6)|<|HOMO(compound 16)|.

A layer which is adjacent to the light-emitting layer that traps only electrons and which is located near the cathode blocks holes.

From Table 2, the energies of the lowest excited triplet states T1 of compounds 16 and 6 satisfy the following expression:

T1(compound 6)−T1(compound 16)>0.1 eV.

Compound 16 is a hydrocarbon compound having a plurality of mono- or higher-valent aromatic hydrocarbon moieties each optionally substituted with an alkyl group, and the aromatic hydrocarbon moieties being linked together only by a single bond. However, a substructure containing the single bond and the aromatic hydrocarbon moieties linked together by the single bond is not represented only by general formula [1] or [2]. From Table 2, for compound 16, the minimum exposed surface area of the single bond between the aromatic hydrocarbon moieties is 87 or less.

Comparative Example 4

A device was produced as in Example 1, except that compound 17 serving as the hole-blocking material was used in place of compound 7.

When a voltage of 5.6 V was applied to the device of this comparative example, blue-light emission originating from the blue-fluorescent dopant material was observed at a luminance of 1109 cd/m$^2$ and a luminous efficiency of 5.46 cd/A. The CIE chromaticity coordinates was (x, y)=(0.16, 0.22).

In the case where a voltage was applied to the device in this comparative example while a constant current density of 100 mA/cm$^2$ was maintained, the length of time that the luminance was reduced to 50% of the initial luminance was 70 hours, which indicated a lifetime shorter than those in Examples 1 to 4.

From Table 1, the energies of the HOMOs of compounds 6 and 17 satisfy the following expression:

|HOMO(compound 6)|<|HOMO(compound 17)|.

A layer which is adjacent to the light-emitting layer that traps only electrons and which is located near the cathode blocks holes.

From Table 2, the energies of the lowest excited triplet states T1 of compounds 6 and 17 do not satisfy the following expression:

T1(host)−T1(HBL)>0.1 eV.

Compound 17 is a hydrocarbon compound having a plurality of mono- or higher-valent aromatic hydrocarbon moieties each optionally substituted with an alkyl group, and the aromatic hydrocarbon moieties being linked together only by a single bond. However, a substructure containing the single bond and the aromatic hydrocarbon moieties linked together by the single bond is not represented only by general formula [1] or [2]. From Table 2, for compound 17, the minimum exposed surface area of the single bond between the aromatic hydrocarbon moieties is 87 or less.

Example 5

Indium tin oxide (ITO) was deposited by sputtering on a glass substrate so as to form a film, which served as an anode, having a thickness of 130 nm. The resulting substrate was used as a transparent conductive supporting substrate. The substrate was subjected to ultrasonic cleaning in acetone and then isopropyl alcohol (IPA), boiling cleaning with IPA, drying, and UV/ozone cleaning.

Compound 1 was used as a material for a hole injection layer. A chloroform solution containing 0.1% by weight compound 1 was prepared.

This solution was dropped on the ITO electrode. Spin coating was performed at 500 RPM for 10 seconds and then at 1000 RPM for 1 minutes to form a thin film. The thin film was dried for 10 minutes at 80° C. in a vacuum oven to completely remove the solvent in the thin film. The resulting hole injection layer had a thickness of 11 nm.

Next, compound 12 was deposited by vacuum evaporation to form an electron-blocking layer having a thickness of 15 nm.

A light-emitting layer was formed by co-evaporation of compound 7 serving as a host material and compound 4 serving as a blue-fluorescent material having the ability to trap only electrons, the compounds 7 and 4 being fed from different boats. The concentration of the light-emitting material was 10% by weight. The light-emitting layer had a thickness of 30 nm.

Compound 5 was deposited by vacuum evaporation to form an electron transport layer having a thickness of 30 nm.

During the evaporation of the organic layers, the degree of vacuum was $7.0 \times 10^{-5}$ Pa or less, and the deposition rate was in the range of 0.08 nm/sec to 0.10 nm/sec. Note that in the case of the light-emitting layer, the deposition rate indicates the total deposition rate of both the host material and the dopant material.

Next, lithium fluoride (LiF) was deposited by vacuum evaporation on the resulting organic layer to form a film having a thickness of 0.5 nm. An aluminum film having a thickness of 150 nm was formed thereon by vacuum evaporation, providing an electron injection electrode (cathode). Thereby, an organic light-emitting device was produced. During the evaporation, the degree of vacuum was $1.0 \times 10^{-4}$ Pa. The deposition rate of lithium fluoride was 0.05 nm/sec. The deposition rate of aluminum was in the range of 1.0 nm/sec to 1.2 nm/sec.

The resulting sample organic light-emitting device was covered with a protective glass plate in a nitrogen atmosphere with a dew point of −70° C. or lower so as not to adsorb water, and was sealed with an epoxy-based adhesive. Note that a recess was formed on the adhesive surface side of the protective glass, and a moisture-absorbent sheet (a moisture getter sheet for organic EL, manufactured by Dynic Corporation) was arranged therein.

For the resulting device, the ITO electrode (anode) was used as a positive electrode. The aluminum electrode (cathode) was used as a negative electrode. When a voltage of 5.6 V was applied between the electrodes, blue-light emission originating from the blue-fluorescent dopant material was observed at a luminance of 2110 cd/m$^2$ and a luminous efficiency of 2.40 cd/A. The CIE chromaticity coordinates was (x, y)=(0.15, 0.20).

In the case where a voltage was applied to the device while a constant current density of 100 mA/cm$^2$ was maintained, the length of time that the luminance was reduced to 50% of the initial luminance was 11 hours, which indicated a satisfactory lifetime.

From Table 1, the energies of the HOMOs and LUMOs of compounds 4 and 7 satisfy the following expressions:

|HOMO(compound 7)|−|HOMO(compound 4)|>0.15 eV, and

|LUMO(compound 4)|<|LUMO(compound 7)|.

The blue-fluorescent material, i.e., compound 4, in the light-emitting layer traps only holes.

From Table 1, the energies of the LUMOs of compounds 7 and 12 satisfy the following expression:

|LUMO(compound 12)|<|LUMO(compound 7)|.

A layer which is adjacent to the light-emitting layer that traps only holes and which is located near the anode blocks electrons.

From Table 2, the energies of the lowest excited triplet states T1 of compounds 7 and 12 satisfy the following expression:

T1(compound 7)−T1(compound 12)>0.1 eV.

Furthermore, each of compounds 7 and 12 is a hydrocarbon compound having a plurality of mono- or higher-valent aromatic hydrocarbon moieties each optionally substituted with an alkyl group, and the aromatic hydrocarbon moieties being linked together only by a single bond. Moreover, a substructure containing the single bond and the aromatic hydrocarbon moieties linked together by the single bond is represented only by general formula [1] or [2]. From Table 2, in each of compounds 7 and 12, the minimum exposed surface area of the single bond between the aromatic hydrocarbon moieties is higher than 87.

Example 6

A device was produced as in Example 5, except that compound 13 serving as the electron-blocking layer was used in place of compound 12.

For the resulting device in this example, the ITO electrode (anode) was used as a positive electrode. The aluminum electrode (cathode) was used as a negative electrode. When a voltage of 5 V was applied between the electrodes, blue-light emission originating from the blue-fluorescent dopant material was observed at a luminance of 1472 cd/m$^2$ and a luminous efficiency of 1.77 cd/A. The CIE chromaticity coordinates was (x, y)=(0.15, 0.23).

In the case where a voltage was applied to the device while a constant current density of 100 mA/cm$^2$ was maintained, the length of time that the luminance was reduced to 50% of the initial luminance was 17 hours, which indicated a satisfactory lifetime.

From Table 1, the energies of the LUMOs of compounds 7 and 13 satisfy the following expression:

|LUMO(compound 13)|<|LUMO(compound 7)|.

A layer which is adjacent to the light-emitting layer that traps only holes and which is located near the anode blocks electrons.

From Table 2, the energies of the lowest excited triplet states T1 of compounds 7 and 13 satisfy the following expression:

T1(compound 7)−T1(compound 13)>0.1 eV.

Furthermore, each of compounds 7 and 13 is a hydrocarbon compound having a plurality of mono- or higher-valent aromatic hydrocarbon moieties each optionally substituted with an alkyl group, and the aromatic hydrocarbon moieties being linked together only by a single bond. Moreover, a substructure containing the single bond and the aromatic hydrocarbon moieties linked together by the single bond is represented only by general formula [1] or [2]. From Table 2, in each of compounds 7 and 13, the minimum exposed surface area of the single bond between the aromatic hydrocarbon moieties is higher than 87.

Comparative Example 5

A device was produced as in Example 5, except that compound 15 serving as the host material in the light-emitting layer was used in place of compound 7.

For the resulting device in this example, the ITO electrode (anode) was used as a positive electrode. The aluminum electrode (cathode) was used as a negative electrode. When a voltage of 8 V was applied between the electrodes, blue-light emission originating from the blue-fluorescent dopant material was observed at a luminance of 545 cd/m$^2$ and a luminous efficiency of 1.89 cd/A. The CIE chromaticity coordinates was (x, y)=(0.15, 0.19).

In the case where a voltage was applied to the device while a constant current density of 100 mA/cm$^2$ was maintained, the length of time that the luminance was reduced to 50% of the initial luminance was 6 hours, which indicated a lifetime shorter than those in Examples 5 and 6.

From Table 1, the energies of the HOMOs and LUMOs of compounds 4 and 15 satisfy the following expressions:

$$|HOMO(\text{compound 15})|-|HOMO(\text{compound 4})|>0.15 \text{ eV, and}$$

$$|LUMO(\text{compound 4})|<|LUMO(\text{compound 15})|.$$

The blue-fluorescent material, i.e., compound 4, in the light-emitting layer traps only holes.

From Table 1, the energies of the LUMOs of compounds 15 and 12 satisfy the following expression:

$$LUMO(\text{compound 12})|<|LUMO(\text{compound 15})|.$$

A layer which is adjacent to the light-emitting layer that traps only holes and which is located near the anode blocks electrons.

From Table 2, the energies of the lowest excited triplet states T1 of compounds 15 and 12 do not satisfy the following expression:

$$T1(\text{host})-T1(\text{EBL})>0.1 \text{ eV}.$$

Compound 15 is a hydrocarbon compound having a plurality of mono- or higher-valent aromatic hydrocarbon moieties each optionally substituted with an alkyl group, and the aromatic hydrocarbon moieties being linked together only by a single bond. In this hydrocarbon compound, however, a substructure containing the single bond and the aromatic hydrocarbon moieties linked together by the single bond is not represented only by general formula [1] or [2]. From Table 2, for compound 15, the minimum exposed surface area of the single bond between the aromatic hydrocarbon moieties is 87 or less.

Comparative Example 6

A device was produced as in Example 6, except that compound 15 serving as the host material in the light-emitting layer was used in place of compound 7.

For the resulting device in this example, the ITO electrode (anode) was used as a positive electrode. The aluminum electrode (cathode) was used as a negative electrode. When a voltage of 8 V was applied between the electrodes, blue-light emission originating from the blue-fluorescent dopant material was observed at a luminance of 565 cd/m$^2$ and a luminous efficiency of 2.37 cd/A. The CIE chromaticity coordinates was (x, y)=(0.15, 0.19).

In the case where a voltage was applied to the device while a constant current density of 100 mA/cm$^2$ was maintained, the length of time that the luminance was reduced to 50% of the initial luminance was 7 hours, which indicated a lifetime shorter than those in Examples 5 and 6.

From Table 1, the energies of the HOMOs and LUMOs of compounds 4 and 15 satisfy the following expressions:

$$|HOMO(\text{compound 15})|-|HOMO(\text{compound 4})|>0.15 \text{ eV, and}$$

$$|LUMO(\text{compound 4})|<|LUMO(\text{compound 15})|.$$

The blue-fluorescent material, i.e., compound 4, in the light-emitting layer traps only holes.

From Table 1, the energies of the LUMOs of compounds 15 and 13 satisfy the following expression:

$$|LUMO(\text{compound 13})|<|LUMO(\text{compound 15})|.$$

A layer which is adjacent to the light-emitting layer that traps only holes and which is located near the anode blocks electrons.

From Table 2, the energies of the lowest excited triplet states T1 of compounds 15 and 13 do not satisfy the following expression:

$$T1(\text{host})-T1(\text{EBL})>0.1 \text{ eV}.$$

Compound 15 is a hydrocarbon compound having a plurality of mono- or higher-valent aromatic hydrocarbon moieties each optionally substituted with an alkyl group, and the aromatic hydrocarbon moieties being linked together only by a single bond. In this hydrocarbon compound, however, a substructure containing the single bond and the aromatic hydrocarbon moieties linked together by the single bond is not represented only by general formula [1] or [2]. From Table 2, for compound 15, the minimum exposed surface area of the single bond between the aromatic hydrocarbon moieties is 87 or less.

Aspects of the present invention provide a blue organic light-emitting device having a long continuous operation lifetime.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-082817, filed Mar. 31, 2010, which is hereby incorporated by reference herein in its entirety.

The invention claimed is:

1. An organic light-emitting device comprising:
a pair of electrodes having an anode and a cathode;
a light-emitting layer arranged between the pair of electrodes, the light-emitting layer containing a host material and a blue-fluorescent dopant material having the ability to trap electrons; and
a hole-blocking layer adjacent to the light-emitting layer, wherein the energy of the lowest unoccupied molecular orbital of the host material (LUMO (host)) and the energy of the LUMO of the blue-fluorescent dopant material (LUMO (dopant)) satisfy the following expression:

$$|LUMO(\text{dopant})|-|LUMO(\text{host})|>0.15 \text{ eV},$$

the energy of the highest occupied molecular orbital of the host material (HOMO (host)) and the energy of the HOMO of the blue-fluorescent dopant material (HOMO (dopant)) satisfy the following expression:

$$|HOMO(\text{host})|<|HOMO(\text{dopant})|,$$

the energy of the lowest excited triplet state of the host material (T1 (host)) and the energy of the lowest excited triplet state of the hole-blocking layer (T1 (HBL)) satisfy the following expression:

$$T1(\text{host})-T1(\text{HBL})>0.1 \text{ eV},$$

the host material and a material for the hole-blocking layer are different hydrocarbon compounds, each of the hydrocarbon compounds having a plurality of mono- or higher-valent unsubstituted or alkyl-substituted aromatic hydrocarbon moieties, and the aromatic hydrocarbon moieties being linked together only by a single bond, and a substructure containing the single bond and the aromatic hydrocarbon moieties linked together by the single bond is represented only by general formula [1] or [2]:

[Chem. 1]

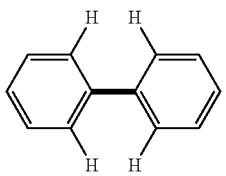

[1]

[Chem. 2]

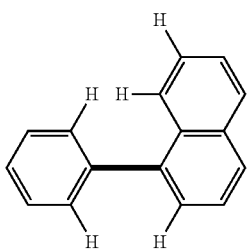

[2]

(wherein thick lines illustrated in formulae [1] and [2] each indicate the single bond).

2. The organic light-emitting device according to claim 1, wherein the minimum exposed surface area of the single bond of each of the host material and the material for the hole-blocking layer is higher than 87 Å$^2$.

3. The organic light-emitting device according to claim 1, wherein the blue-fluorescent dopant material having the ability to trap electrons is a hydrocarbon compound having the substructure containing a fluoranthene skeleton.

4. An organic light-emitting device comprising:

a pair of electrodes having an anode and a cathode, a light-emitting layer arranged between the pair of electrodes, the light-emitting layer containing a host material and a blue-fluorescent dopant material having the ability to trap holes, and an electron-blocking layer adjacent to the light-emitting layer, wherein the energy of the lowest unoccupied molecular orbital of the host material (LUMO (host)) and the energy of the LUMO of the blue-fluorescent dopant material (LUMO (dopant)) satisfy the following expression:

|LUMO(host)|>|LUMO(dopant)|, the energy of the highest occupied molecular orbital of the host material (HOMO (host)) and the energy of the HOMO of the blue-fluorescent dopant material (HOMO (dopant)) satisfy the following expression:

|HOMO(host)|−|HOMO(dopant)|>0.15 eV, the energy of the lowest excited triplet state of the host material (T1 (host)) and the energy of the lowest excited triplet state of the electron-blocking layer (T1 (EBL)) satisfy the following expression:

T1(host)−T1(EBL)>0.1 eV, the host material and a material for the electron-blocking layer are different hydrocarbon compounds, each of the hydrocarbon compounds having a plurality of mono- or higher-valent unsubstituted or alkyl-substituted aromatic hydrocarbon moieties, and the aromatic hydrocarbon moieties being linked together only by a single bond, and a substructure containing the single bond and the aromatic hydrocarbon moieties linked together by the single bond is represented only by general formula [1] or [2]:

[Chem. 3]

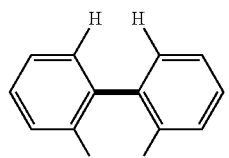

[1]

[Chem. 4]

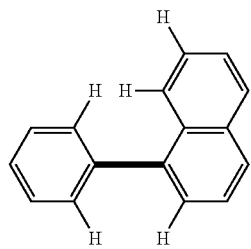

[2]

(wherein thick lines illustrated in formulae [1] and [2] each indicate the single bond).

5. The organic light-emitting device according to claim 4, wherein the minimum exposed surface area of the single bond of each of the host material and the material for the electron-blocking layer is higher than 87 Å$^2$.

6. The organic light-emitting device according to claim 1, wherein the host material contained in the light-emitting layer has an energy of the lowest excited triplet state T1 of 2.5 eV or less.

* * * * *